United States Patent
Yoshino et al.

(10) Patent No.: US 12,131,936 B2
(45) Date of Patent: Oct. 29, 2024

(54) ALIGNMENT AND TRANSPORT OF SUBSTRATE AND FOCUS RING

(71) Applicant: KABUSHIKI KAISHA YASKAWA DENKI, Kitakyushu (JP)

(72) Inventors: Keisuke Yoshino, Fukuoka (JP); Tatsuyuki Urata, Fukuoka (JP)

(*) Notice: Subject to any disclaimer, the term of this patent is extended or adjusted under 35 U.S.C. 154(b) by 445 days.

(21) Appl. No.: 17/394,359

(22) Filed: Aug. 4, 2021

(65) Prior Publication Data
US 2022/0059384 A1   Feb. 24, 2022

(30) Foreign Application Priority Data
Aug. 18, 2020   (JP) ................... 2020-138214

(51) Int. Cl.
*H01L 21/68*   (2006.01)
*H01J 37/32*   (2006.01)
(Continued)

(52) U.S. Cl.
CPC ...... *H01L 21/681* (2013.01); *H01J 37/32642* (2013.01); *H01J 37/32733* (2013.01);
(Continued)

(58) Field of Classification Search
CPC ............. H01L 21/681; H01L 21/67259; H01L 21/68707; H01L 21/6875; H01L 21/68;
(Continued)

(56) References Cited

U.S. PATENT DOCUMENTS 11,694,880 B2 * 7/2023 Mao .................. H01L 21/68721
                                                       156/345.24
2015/0314314 A1   11/2015 Kuwahara
(Continued)

FOREIGN PATENT DOCUMENTS

JP   2011-181721    9/2011
JP   2015-211205    11/2015
(Continued)

OTHER PUBLICATIONS

Office Action issued in Japanese Patent Application No. P2020-138214, dated Jan. 16, 2024 (with English partial translation).
(Continued)

*Primary Examiner* — Sohana Tanju Khayer
(74) *Attorney, Agent, or Firm* — SOEI PATENT & LAW FIRM

(57) ABSTRACT

An alignment apparatus includes a rotational support configured to rotate around a central axis, a rotation actuator, an edge sensor, and control circuitry. The rotational support includes substrate supports configured to concurrently support a substrate, and ring supports configured to concurrently support a focus ring. The rotation actuator is configured to rotate the rotational support around the central axis. The edge sensor is configured to generate an edge signal that changes in accordance with each of an edge position of the substrate and an edge position of the focus ring. The control circuitry is configured to control the rotation actuator to adjust a posture of the substrate to a first target posture based on the edge signal, and to control the rotation actuator to adjust a posture of the focus ring to a second target posture based on the edge signal.

20 Claims, 12 Drawing Sheets

(51) Int. Cl.
*H01L 21/67* (2006.01)
*H01L 21/687* (2006.01)

(52) U.S. Cl.
CPC .. *H01L 21/67259* (2013.01); *H01L 21/68707* (2013.01); *H01L 21/6875* (2013.01); *H01J 2237/334* (2013.01); *H01L 21/68* (2013.01)

(58) Field of Classification Search
CPC .......... H01L 21/67778; H01L 21/67742; H01J 37/32642; H01J 37/32733; H01J 2237/334
See application file for complete search history.

(56) References Cited

U.S. PATENT DOCUMENTS

| | | | |
|---|---|---|---|
| 2017/0363407 A1 | 12/2017 | Sugita et al. | |
| 2018/0350644 A1 | 12/2018 | Matsuura | |
| 2019/0122870 A1* | 4/2019 | Ishizawa | H01J 37/32862 |
| 2019/0164804 A1* | 5/2019 | Tzeng | C23C 16/4586 |
| 2020/0098550 A1* | 3/2020 | Takahashi | H01L 21/68735 |
| 2020/0168442 A1* | 5/2020 | Kim | H01J 37/32532 |
| 2020/0173018 A1* | 6/2020 | Hiester | H01J 37/32715 |
| 2020/0176228 A1* | 6/2020 | Oka | H01J 37/32642 |
| 2020/0194295 A1* | 6/2020 | Sugita | H01L 21/67742 |
| 2020/0273678 A1* | 8/2020 | Funk | H01J 37/32642 |
| 2020/0365405 A1* | 11/2020 | Zucker | H01L 21/67167 |
| 2020/0388471 A1* | 12/2020 | Takebayashi | H01L 21/68735 |
| 2021/0035782 A1* | 2/2021 | Jiong | H01J 37/32082 |
| 2021/0050240 A1* | 2/2021 | Moyama | H01L 21/67346 |
| 2021/0272783 A1* | 9/2021 | Toyomaki | H01J 37/32642 |
| 2021/0319988 A1* | 10/2021 | Moyama | H01J 37/32733 |

FOREIGN PATENT DOCUMENTS

| | | |
|---|---|---|
| JP | 2017-228754 | 12/2017 |
| JP | 2018-206992 | 12/2018 |
| JP | 2020-096122 | 6/2020 |
| JP | 2021-136344 | 9/2021 |

OTHER PUBLICATIONS

Office Action issued in Korean Patent Application No. 10-2021-0105428, dated Aug. 26, 2024 (with English partial translation.

* cited by examiner

ALIGNMENT AND TRANSPORT OF SUBSTRATE AND FOCUS RING

CROSS-REFERENCE TO RELATED APPLICATIONS

This application is based upon and claims the benefit of priority from Japanese Patent Application No. 2020-138214, filed on Aug. 18, 2020, the entire contents of which are incorporated herein by reference.

BACKGROUND

Field

The present disclosure relates to an alignment apparatus, a substrate transport system, and a substrate transport method.

Description of the Related Art

Japanese Unexamined Patent Application Publication No. 2011-181721 discloses an alignment apparatus including a line sensor for detecting edges of wafers. This alignment apparatus is configured to detect an edge of a silicon wafer and an edge of a bonded wafer including a glass substrate for supporting a wafer. This alignment apparatus is configured to perform each of the detection for the edge of the silicon wafer and the detection for the edge of the glass substrate.

SUMMARY

An example alignment apparatus includes a rotational support configured to rotate around a central axis, a rotation actuator, an edge sensor, and control circuitry. The rotational support includes a plurality of substrate supports surrounding the central axis and configured to concurrently support a substrate, and a plurality of ring supports surrounding the central axis and configured to concurrently support a focus ring. The rotation actuator is configured to rotate the rotational support around the central axis. The edge sensor is configured to generate an edge signal that changes in accordance with each of an edge position of the substrate supported by the substrate supports and an edge position of the focus ring supported by the ring supports. Additionally, the control circuitry is configured to control the rotation actuator to adjust a posture of the substrate around the central axis to a first target posture based on the edge signal, and to control the rotation actuator to adjust a posture of the focus ring around the central axis to a second target posture based on the edge signal.

Also disclosed herein is a method that includes detecting an edge position of a substrate supported by a rotational support at a plurality of positions surrounding a central axis with an edge sensor, and rotating the rotational support around the central axis to adjust a posture of the substrate around the central axis to a first target posture based on the edge position of the substrate detected by the edge sensor. The method further includes detecting an edge position of a focus ring supported by the rotational support at a plurality of positions surrounding the central axis with the edge sensor, and rotating the rotational support around the central axis to adjust a posture of the focus ring around the central axis to a second target posture based on the edge position of the focus ring detected by the edge sensor.

Also disclosed herein is a method that includes detecting an edge position of a substrate with an edge sensor provided around a central axis while a rotational support that is supporting the substrate at a plurality of positions surrounding the central axis is rotating. The method further includes generating a substrate edge profile based on the edge position of the substrate detected by the edge sensor, the substrate edge profile indicating a relationship between a rotation angle of the rotational support around the central axis and the edge position of the substrate. The method further includes calculating a center position of the substrate in the rotational support based on the substrate edge profile and adjusting a position of a hand of a transfer robot based on the center position of the substrate and controlling the transfer robot so that the hand supports and transports the substrate. The method further includes detecting an edge position of a focus ring with the edge sensor while the rotational support that is supporting the focus ring at a plurality of positions surrounding the central axis is rotating. The method further includes generating a ring edge profile based on the edge position of the focus ring detected by the edge sensor, the ring edge profile indicating a relationship between the rotation angle of the rotational support around the central axis and the edge position of the focus ring. The method further includes calculating a center position of the focus ring in the rotational support based on the ring edge profile and adjusting the position of the hand based on the center position of the focus ring and controlling the transfer robot so that the hand supports and transports the focus ring.

DETAILED DESCRIPTION

Figure 1:
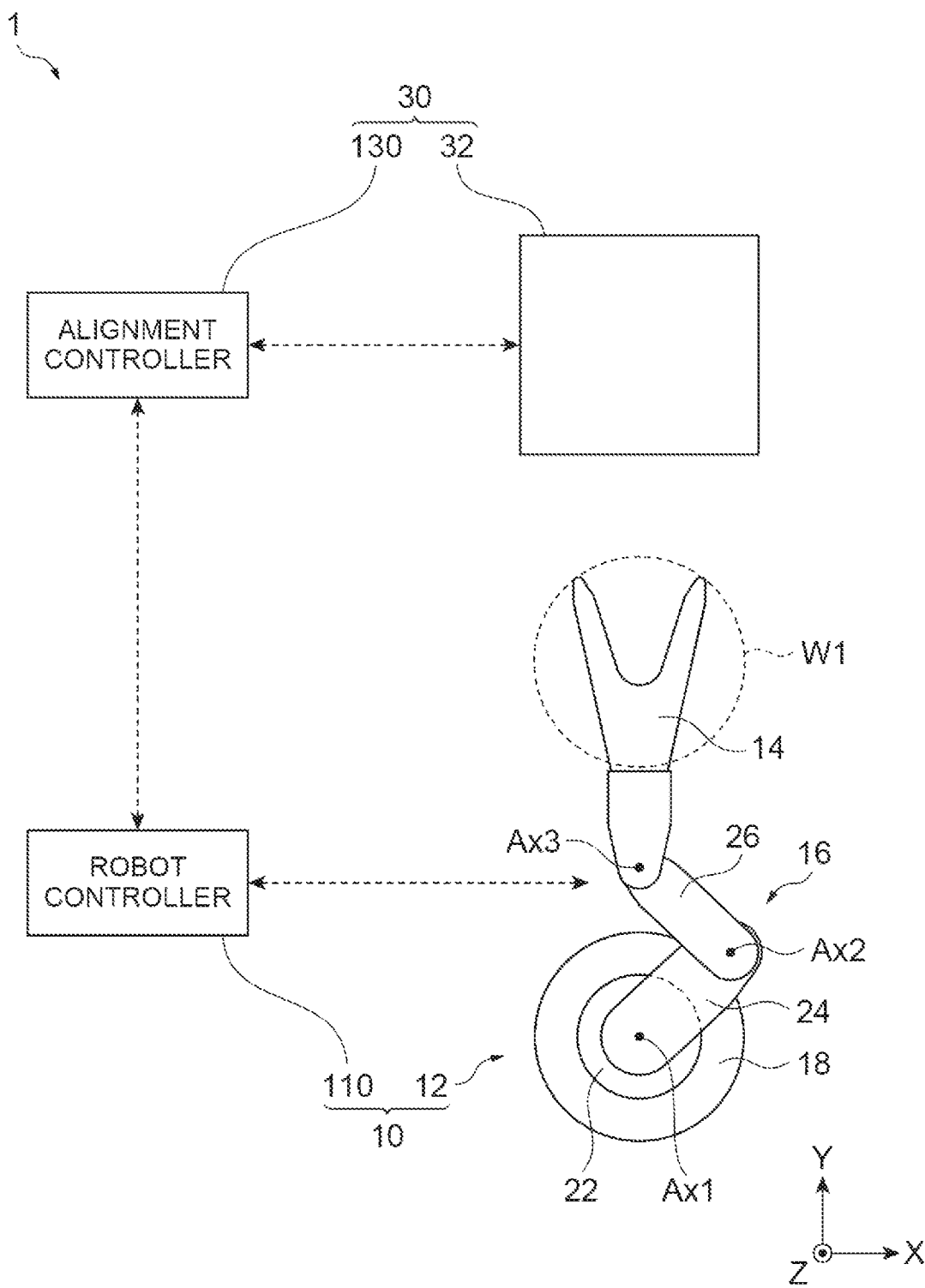
FIG. 1 is a schematic diagram of an example substrate transport system.

In the following description, with reference to the drawings, the same elements or the elements having the same function are denoted by the same reference numerals, and the redundant description is omitted. In some drawings, an orthogonal coordinate system defined by an X axis, a Y axis, and a Z axis is shown. For example, the Z axis corresponds to the vertical direction, and the X axis and the Y axis correspond to the horizontal directions.

Substrate Transport System

An example transport system 1 (substrate transport system) illustrated in FIG. 1 may be configured to transport a workpiece by adjusting at least one of a posture of the workpiece and a position of the workpiece. The transport system 1 transports at least two types of workpieces individually. The workpieces to be transported by the transport system 1 include a substrate W1 and a focus ring W2. For example, the substrate W1 is a semiconductor wafer having a circular shape. The focus ring W2 is a tool used for plasma processing (etching treatment) for the substrate W1. For example, the focus ring W2 is disposed to cover or surround a peripheral edge portion of the substrate W1 placed on a stage in the plasma processing for the substrate W1. An outer diameter of the substrate W1 may be smaller than an outer diameter of the focus ring W2. The outer diameter of the substrate W1 may be substantially equal to an inner diameter of the focus ring W2. A difference between the outer diameter of the substrate W1 and an inner diameter of the focus ring W2 may be smaller than a difference between the outer diameter of the substrate W1 and the outer diameter of the focus ring W2.

The transport system 1 is provided in a substrate processing apparatus that sequentially performs predetermined processing on a plurality of substrates W1. For example, the transport system 1 individually transports the substrate W1 before processing or the focus ring W2 before using at different timings in the transport chamber of the substrate processing apparatus. The transport system 1 may adjust the posture and the position of the substrate W1 when transporting the substrate W1, and may adjust the posture and the position of the focus ring W2 when transporting the focus ring W2. The transport system 1 includes a robot apparatus 10 and an alignment apparatus 30.

Robotic Apparatus

The robot apparatus 10 includes, for example, a transfer robot 12 and a robot controller 110. The transfer robot 12 individually carries the substrate W1 or the focus ring W2 into or out of the alignment apparatus 30. For example, when the workpiece to be transported is the substrate W1, the transfer robot 12 carries the substrate W1 into or out of the alignment apparatus 30. When the workpiece to be transported is the focus ring W2, the transfer robot 2 carries the focus ring W2 into or out of the alignment apparatus 30.

The transfer robot 12 includes, for example, a base 18, an elevating unit 22, and a transfer arm 16. The transfer arm 16 includes, for example, a hand 14, a first arm 24, and a second arm 26. The hand 14 individually supports the substrate W1 or the focus ring W2. The hand 14 may support each of the substrate W1 and the focus ring W2 by any holding method. For example, the hand 14 may hold the workpiece by suction or the hand 14 may grip the workpiece.

The base 18 is installed at a predetermined position in the substrate processing apparatus (for example, in the transfer chamber). The base 18 may be fixed on a bottom surface in the substrate processing apparatus or may be fixed on a movable portion that moves horizontally in the substrate processing apparatus. The elevating unit 22 protrudes vertically upward from the base 18 and is capable of moving up and down along a vertical axial line Ax1.

The first arm 24 is connected to an upper end portion of the elevating unit 22. The first arm 24 extends horizontally from the upper end portion of the elevating unit 22 and is rotatable around the axial line Ax1. The second arm 26 extends horizontally from a distal end portion of the first arm 24, and is rotatable around a vertical axial line Ax2 passing through the distal end portion of the first arm 24. A distal end portion of the second arm 26 is connected to a proximal end portion of the hand 14. The hand 14 is rotatable around a vertical axial line Ax3 passing through the distal end portion of the second arm 26.

The transfer arm 16 may include a plurality of actuators for moving the hand 14. The plurality of actuators include, for example, an actuator that rotates the first arm 24 around the axial line Ax1, an actuator that rotates the second arm 26 around the axial line Ax2, and an actuator that rotates the hand 14 around the axial line Ax3. For example, an actuator of the transfer arm 16 is an actuator including a power source such as an electric motor. The transfer robot 12 may include a lifting actuator that lifts and lowers the elevating unit 22 along the axial line Ax1.

The position of the hand 14 in the horizontal direction (an X-Y plane in the drawing) varies by controlling the actuators that respectively rotate the first arm 24 and the second arm 26. The height position (the position in the Z-axis direction in the drawing) of the hand 14 varies by controlling the lifting actuator that lifts and lowers the elevating unit 22. In the example configuration of the transfer robot 12, the position and orientation (posture) of the hand 14 in the horizontal direction and the height position of the hand 14 can be freely adjusted. As described above, the transfer robot 12 supports and transports (conveys) the substrate W1 or the focus ring W2 with the hand 14.

The robot controller 110 controls the transfer robot 12 (each actuator) to move the hand 14 to the target position, the target posture, and the target height. The configuration of the robot controller 110 will be described in further detail later.

Alignment Apparatus

The alignment apparatus 30 adjusts a posture of the substrate W1 received from the transfer robot 12 and detects a center position of the substrate W1 when the workpiece to be transported is the substrate W1. The alignment apparatus 30 adjusts a posture of the focus ring W2 received from the transfer robot 12 and detects a center position of the focus ring W2 when the workpiece to be transported is the focus ring W2. After the horizontal position of the hand 14 of the transfer robot 12 is adjusted based on the center position of the workpiece (the substrate W1 or the focus ring W2) detected by the alignment apparatus 30, the hand 14 receives the workpiece. Performing these two operations enables the center position of the workpiece to be adjusted.

Figure 2:
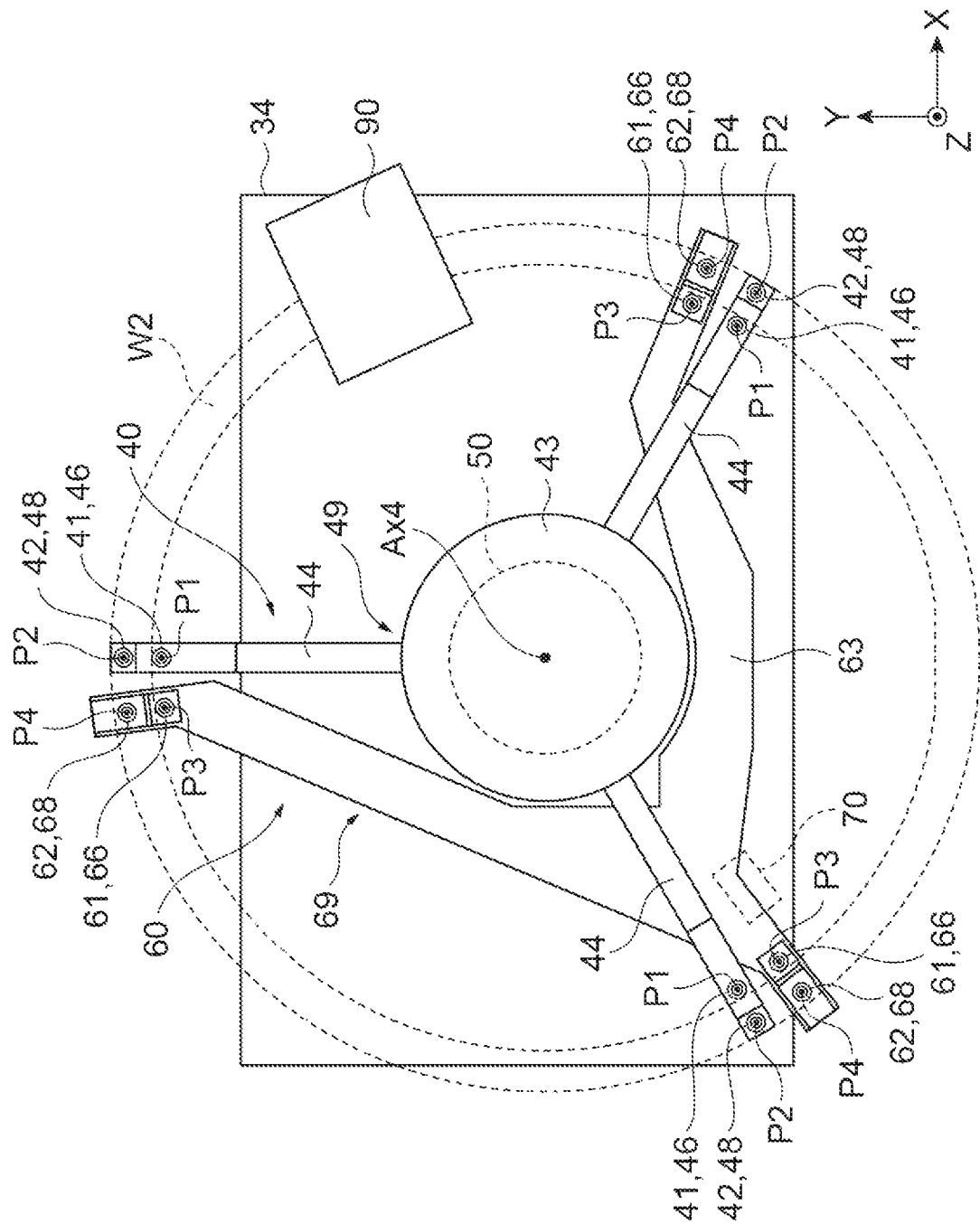
FIG. 2 is a plan view of an example alignment apparatus.

The alignment apparatus 30 includes, for example, a posture adjustment unit 32 and an alignment controller 130. As shown in FIG. 2, the posture adjustment unit 32 includes a base 34, a rotational support 40, a rotation actuator 50, a lifting support 60, a lifting actuator 70, and an edge sensor 90. The base 34 is installed at a predetermined position in the substrate processing apparatus (for example, in the transfer chamber).

The rotational support 40 is disposed above the base 34 and is rotatable around the central axis Ax4. For example, the central axis Ax4 passes through the base 34 and is set along a vertical line. The rotational support 40 supports the substrate W1 at a plurality of positions P1 surrounding the central axis Ax4 when the workpiece to be transported is the substrate W1. The rotational support 40 supports the focus ring W2 at a plurality of positions P2 surrounding the central axis Ax4 when the workpiece to be transported is the focus ring W2. The rotational support 40 horizontally supports the substrate W1 and horizontally supports the focus ring W2.

For example, the rotational support 40 includes a rotatable portion 49, a plurality of first substrate supports 41 (substrate supports), and a plurality of first ring supports 42 (ring supports). The rotatable portion 49 is provided to be rotatable around the central axis Ax4. The first substrate supports 41 are provided in the rotatable portion 49 and support the substrate W1 at a plurality of positions P1 surrounding the central axis Ax4. The first ring supports 42 are provided in the rotatable portion 49 and supports the focus ring W2 at a plurality of positions P2 surrounding the central axis Ax4.

The plurality of positions P1 are located on a circumference around the central axis Ax4. The plurality of positions P1 may be arranged at equal intervals in a circumferential direction around the central axis Ax4. A diameter of the circumference on which the plurality of positions P1 are located are smaller than the diameter of the substrate W1. The plurality of positions P2 are located on a circumference around the central axis Ax4. The plurality of positions P2 may be arranged at equal intervals in a circumferential direction around the central axis Ax4. A diameter of the circumference on which the plurality of positions P2 are located are smaller than an outer diameter of the focus ring W2. The diameter of the circumference on which the plurality of positions P2 are located may be larger than the diameter of the circumference on which the plurality of positions P1 are located.

The rotatable portion 49 includes, for example, a rotational body 43 and a plurality of rotating arms 44. The rotational body 43 is fixed to substantially the center of the upper surface of the base 34 via the rotation actuator 50. The rotational body 43 is formed in a cylindrical shape. The rotational body 43 is provided such that the center thereof substantially coincides with the central axis Ax4. The plurality of rotational arm 44 extend radially in the horizontal direction around the central axis Ax4. For example, the plurality of rotational arm 44 extend radially from the side surface of the rotational body 43. The first substrate supports 41 and the first ring supports 42 may be provided at distal end portions of the rotational arm 44.

Figure 3:
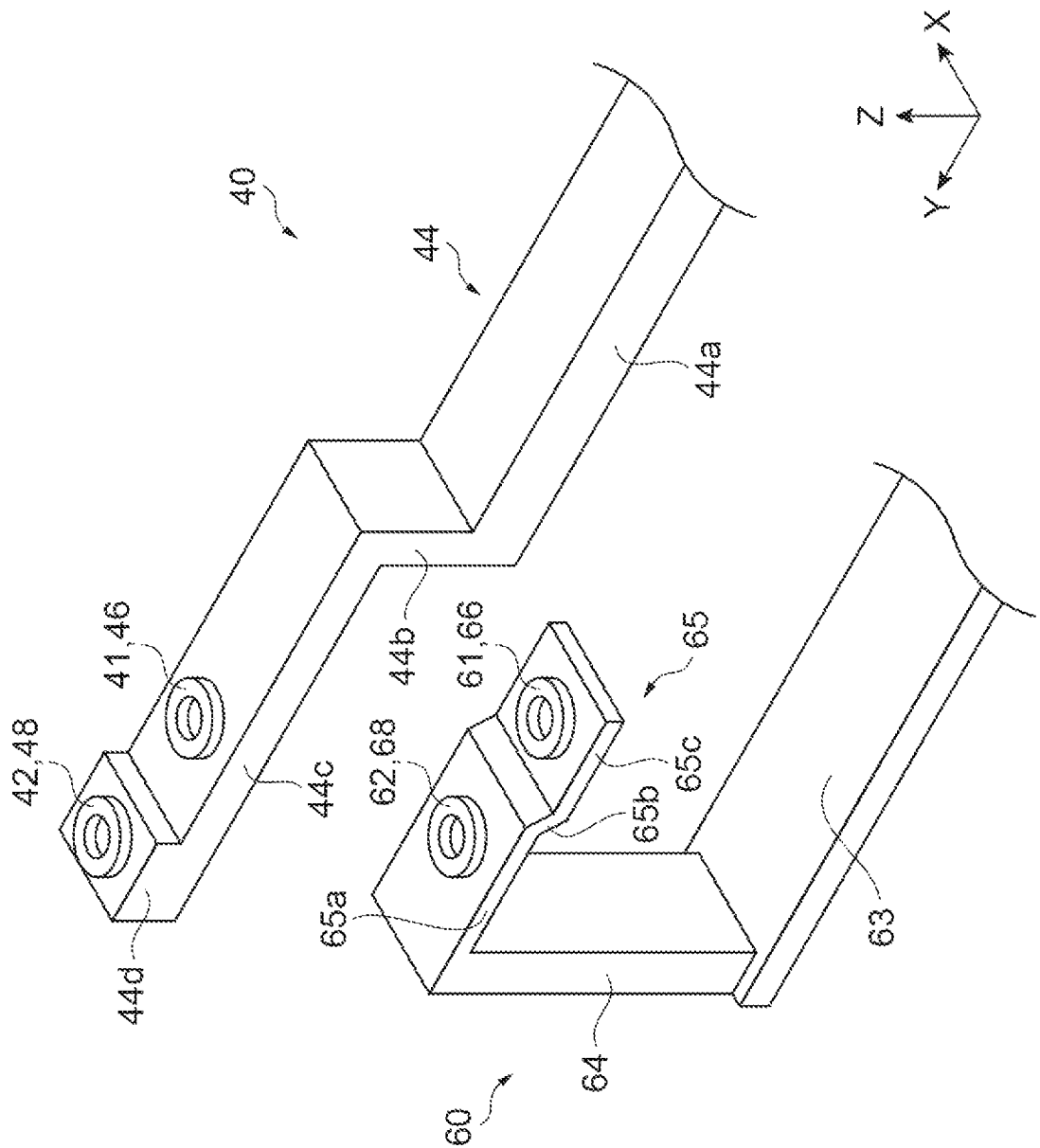
FIG. 3 is a perspective view of an example rotational support and a lifting support.

As shown in FIG. 3, the rotational arm 44 includes a proximal end portion 44a, a connecting portion 44b, a distal end portion 44c, and a protrusion portion 44d. The proximal end portion 44a has one end portion (an end portion close to the central axis Ax4) connected to the rotational body 43, and extends from a connecting point with the rotational body 43 in a direction away from the central axis Ax4. A lower end portion of the connecting portion 44b is connected to the other end portion of the proximal end portion 44a. The connecting portion 44b extends upward from a connecting point with the proximal end portion 44a. One end portion (end portion close to the central axis Ax4) of the distal end portion 44c is connected to an upper end portion of the connecting portion 44b.

The distal end portion 44c extends from a connecting point with the connecting portion 44b in a direction away from the central axis Ax4. The protruding portion 44d is provided on an upper surface of the other end portion of the distal end portion 44c. The protruding portion 44d is formed to protrude upward from the upper surface (exposed upper surface) of the distal end portion 44c. A height position of the upper surface of the protruding portion 44d is higher than a height position of the upper surface of the distal end portion 44c. As described above, a step having different height positions is provided at the outer end portion of the rotational arm 44. The step can prevent an excessive deviation between the center position of the substrate W1 and the central axis Ax4 in the rotational support 40.

The rotational support 40 includes a plurality of first pads 46 as the first substrate supports 41 and a plurality of second pads 48 as the first ring supports 42. The first pads 46 are respectively provided on the rotating arms 44. The second pads 48 are respectively provided on the rotating arms 44. The material forming the first pad 46 provided on each rotational arm 44 includes an elastomer (for example, rubber). The first pads 46 concurrently support the substrate W1. In a state where the substrate W1 is supported (placed) on the first pads 46, the substrate W1 is held by friction between the first pads 46 and the substrate W1. The first pad 46 is provided on the upper surface of the distal end portion 44c of the rotational arm 44. The first pad 46 may be formed in a ring shape in plan view. Since the first pads 46 have a function of supporting the substrate W1, the positions of the first pads 46 correspond to the positions P1.

The material forming the second pad 48 provided on each rotational arm 44 includes an elastomer (for example, rubber). The second pads 48 concurrently support the focus ring W2. In a state where the focus ring W2 is supported (placed) on the second pad 48, the focus ring W2 is held by friction between the second pads 48 and the focus ring W2. The second pad 48 is provided on the upper surface of the protruding portion 44d of the rotational arm 44. The second pad 48 may be formed in a ring shape in plan view. Since the second pads 48 have a function of supporting the focus ring W2, the positions of the second pads 48 correspond to the positions P2.

The first pad 46 and the second pad 48 may have the same shape as each other. The first pad 46 and the second pad 48 may be formed of the same material. The first pad 46 is located closer to the central axis Ax4 than the second pad 48. In other words, a distance between the second pad 48 and the central axis Ax4 is greater than a distance between the first pad 46 and the central axis Ax4. In some examples, the central axis Ax4, the first pad 46, and the second pad 48 are arranged in this order along a radial direction of the circumference around the central axis Ax4. The first substrate supports 41 may be located closer to the central axis Ax4 than the first ring supports 42. The first ring supports 42 may be positioned at different heights from the first substrate supports 41 in an axial direction of the central axis Ax4. The axial direction is a direction in which the central axis Ax4 extends. The first ring supports 42 may be positioned higher than the first substrate supports 41 in the axial direction.

A thickness (a length in the Z-axis direction) of the first pad 46 and a thickness (a length in the Z-axis direction) of the second pad 48 may substantially coincide with each other. A height position of the upper surface of the second pad 48 may be higher than a height position of the upper surface of the first of pad 46. In some examples, a height position of a lower surface (back surface) of the focus ring W2 supported by the second pads 48 is higher than a height position of a lower surface (back surface) of the substrate W1 supported by the first pads 46. Thus, a height position at which the first ring supports 42 supports the focus ring W2 may be higher than a height position at which the first substrate supports 41 support the substrate W1.

Figure 4A:
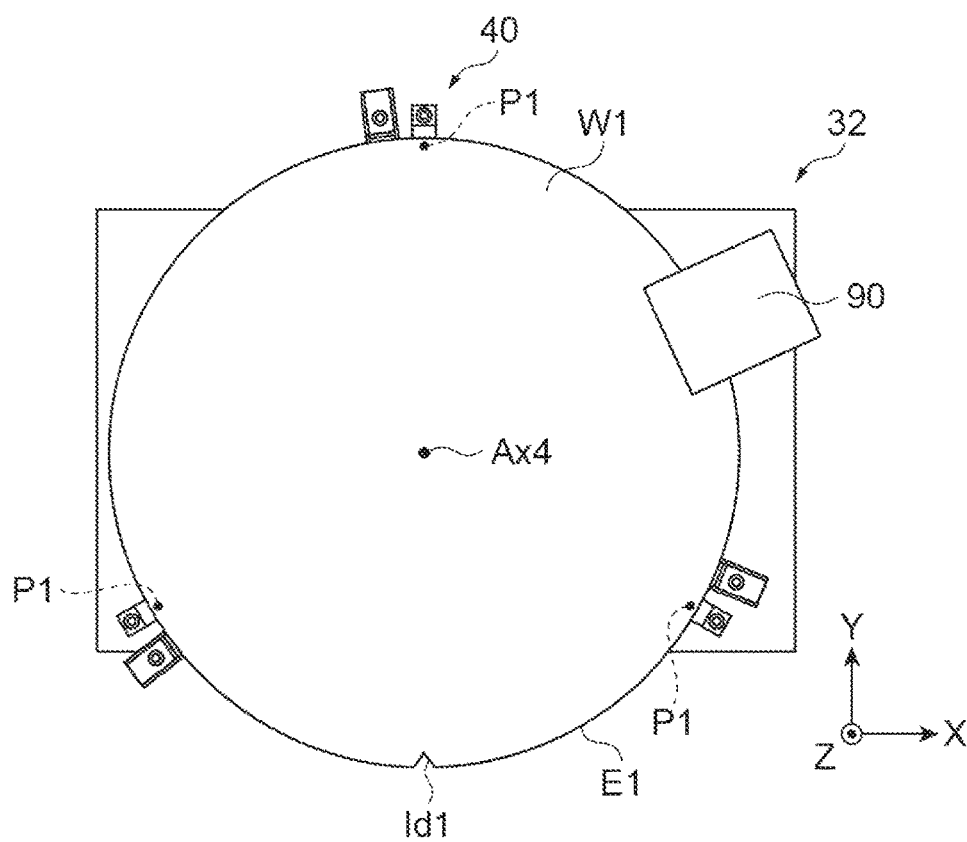
FIG. 4A is a plan view of the alignment apparatus of FIG. 2, illustrating an example operation of supporting a substrate.
Figure 4B:
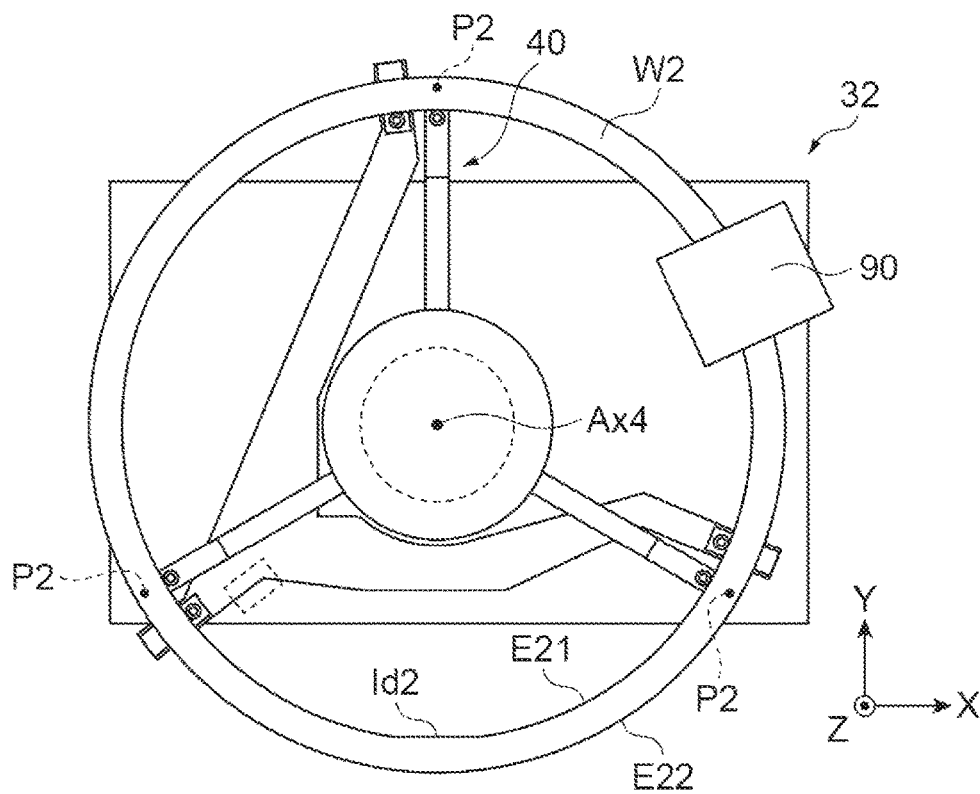
FIG. 4B is a plan view of the alignment apparatus of FIG. 2, illustrating an example operation of supporting a focus ring.

With the example rotating support 40 described above, the plurality of first pads 46 support the substrate W1 when the workpiece to be conveyed is the substrate W1. The plurality of second pads 48 support the focus ring W2 when the workpiece to be conveyed is the focus ring W2. FIG. 4A illustrates the posture adjustment unit 32 in a state where the first pads 46 (first substrate support 41) support the substrate W1. FIG. 4B illustrates the posture adjustment unit 32 in a state where the second pads 48 (first rings support 42) support the focus ring W2. The rotational support 40 may be configured to support the workpiece in a state of holding the workpiece by suction instead of holding the workpiece with pads including an elastomer. Three rotating arms 44 are included in the rotational support 40 illustrated in FIG. 2, but in other examples the rotational support may include two rotating arms 44 or four or more rotating arms 44.

The rotation actuator 50 rotates the rotational support 40 around the central axis Ax4. For example, the rotation actuator 50 is provided on the upper surface of the base 34 and supports the rotational body 43 of the rotational support 40. The rotation actuator 50 is, for example, a rotary actuator that rotates the rotational body 43 around the central axis Ax4 by a power source including an electric motor. When the rotational support 40 (the rotational body 43) is rotated by the rotation actuator 50, the first substrate supports 41 (for example, the first pads 46) and the first ring supports 42 (for example, the second pads 48) are rotated around the central axis Ax4. Accordingly, the substrate W1 rotates around the central axis Ax4 when the substrate W1 is supported by the rotational support 40. The focus ring W2 rotates around the central axis Ax4 when the focus ring W2 is supported by the rotational support 40.

The lifting support 60 is disposed above the base 34 and is provided not to move even when the rotational support 40 rotates. The lifting support 60 supports the substrate W1 at a plurality of positions P3 surrounding the central axis Ax4 when the workpiece to be transported is the substrate W1. The lifting support 60 supports the focus ring W2 at a plurality of positions P4 surrounding the central axis Ax4 when the workpiece to be transported is the focus ring W2. The lifting support 60 horizontally supports the substrate W1 and horizontally supports the focus ring W2, similarly to the rotational support 40.

For example, the lifting support 60 includes a liftable portion 69, a plurality of second substrate supports 61, and a plurality of second ring supports 62. The liftable portion 69 is provided to be movable along the central axis Ax4. The second substrate supports 61 are provided on the liftable portion 69 and support the substrate W1 at a plurality of positions P3 surrounding the central axis Ax4. The second ring supports 62 are provided on the liftable portion 69 and supports the focus ring W2 at a plurality of positions P4 surrounding the central axis Ax 4.

The plurality of positions P3 are located on a circumference around the central axis Ax4. The plurality of positions P3 may be arranged at equal intervals in a circumferential direction around the central axis Ax4. A diameter of the circumference on which the plurality of positions P3 are located are smaller than the diameter of the substrate W1. The plurality of positions P4 are located on a circumference around the central axis Ax4. The plurality of positions P4 may be arranged at equal intervals in a circumferential direction around the central axis Ax4. A diameter of the circumference on which the plurality of positions P4 are located are smaller than the outer diameter of the focus ring W2. The diameter of the circumference on which the plurality of positions P4 are located may be larger than the diameter of the circumference on which the plurality of positions P3 are located.

The liftable portion 69 includes, for example, a bottom portion 63, a plurality of connecting portions 64, and a plurality of tip portions 65. The bottom portion 63 is formed in a plate shape. The bottom portion 63 is formed not to overlap the rotational body 43 of the rotational support 40 in plan view. The bottom portion 63 is provided with end portions at a plurality of positions around the central axis Ax4. The bottom portion 63 is formed so as to extend from one end portion toward the central axis Ax4 and branch off to extend toward two other end portions. A distance between each of the end portions of the bottom portion 63 and the central axis Ax4 is larger than half of the outer diameter of the focus ring W2.

As shown in FIG. 3, the connecting portions 64 are formed to extend along the vertical direction. A lower end portion of the connecting portion 64 is connected to one of the end portions of the bottom portion 63. The tip portions 65 are respectively connected to upper end portions of the connecting portions 64. The tip portion 65 extends toward the central axis Ax4 from a connecting point with the upper end portion of the connecting portion 64. The second substrate supports 61 and the second ring supports 62 may be provided on the tip portions 65.

The tip portion 65 includes, for example, an upper step portion 65a, an inclined portion 65b, and a lower step portion 65c. One end portion of the upper step portion 65a is connected to the upper end portion of the connecting portion 64 and extends toward the central axis Ax4.

One end portion of the inclined portion 65b is connected to the other end portion of the upper step portion 65a. The inclined portion 65b extends obliquely downward in the vertical direction from a connecting point with the upper step portion 65a so as to approach the central axis Ax4. One end portion of the lower step portion 65c is connected to the other end portion of the inclined portion 65b. The lower step portion 65c extends from a connecting point with the inclined portion 65b toward the central axis Ax4. A height position of the upper surface of the upper step portion 65a is higher than a height position of the upper surface of the lower step portion 65c. In this manner, the tip portion 65 is provided with a step having different height positions. This step can prevent an excessive deviation between the center position of the substrate W1 and the central axis Ax4 in the lifting support 60.

The lifting support 60 includes a plurality of third pads 66 as the second substrate supports 61 and a plurality of fourth pads 68 as the second ring supports 62. The third pads 66 are respectively provided at the tip portions 65. The fourth pads 68 are respectively provided at the tip portions 65. The material forming the third pad 66 provided at each tip portion 65 includes an elastomer (for example, rubber). The third pads 66 support the back surface of the substrate W1 near the outer peripheral edge of the substrate W1. In a state where the substrate W1 is supported (placed) on the third pad 66, the substrate W1 is held by friction between the third pads 66 and the substrate W1. The third pad 66 is provided on the upper surface of the lower step portion 65c of the tip portion 65. The third pad 66 may be formed in a ring shape in plan view. Since the third pads 66 have a function of supporting the substrate W1, the positions of the third pads 66 correspond to the positions P3.

The material forming the fourth pad 68 provided at each of the tip portions 65 includes an elastomer (for example, rubber). The fourth pads 68 support the back surface of the focus ring W2 near the outer peripheral edge of the focus ring W2. In a state where the focus ring W2 is supported (placed) on the fourth pads 68, the focus ring W2 is held by friction between the fourth pads 68 and the focus ring W2. The fourth pad 68 is provided on the upper surface of the upper step portion 65a of the tip portion 65. The fourth pad 68 may be formed in a ring shape in plan view. Since the fourth pads 68 have a function of supporting the focus ring W2, the positions of the fourth pads 68 correspond to the positions P4.

The third pad 66 and the fourth pad 68 may have the same shape as each other. The third pad 66 and the fourth pad 68 may be formed of the same material. The third pad 66 is located closer to the central axis Ax4 than the fourth pad 68. In other words, a distance between the fourth pad 68 and the central axis Ax4 is greater than a distance between the third pad 66 and the central axis Ax4. In some examples, the central axis Ax4, the third pad 66, and the fourth pad 68 are arranged in this order along the radial direction of the circumference around the central axis Ax4. The second substrate support 61 may be located closer to the central axis Ax4 than the second ring support 62. The second ring supports 62 may be positioned at different heights from the second substrate supports 61 in the axial direction of the central axis Ax4. The second ring supports 62 may be positioned higher than the second substrate supports 61 in the axial direction.

A height position of an upper surface of the fourth pad 68 may be higher than a height position of an upper surface of the third pad 66. In some examples, the height position of the lower surface of the focus ring W2 supported by the fourth pads 68 is higher than the height position of the lower surface of the substrate W1 supported by the third pads 66. Thus, a height position at which the second ring supports 62 support the focus ring W2 may be higher than a height position at which the second substrate support 61 supports the substrate W1.

With the example lifting support 60 described above, the third pads 66 respectively provided on the tip portions 65 function as the second substrate supports. The fourth pads 68 respectively provided on the tip portions 65 function as the second ring supports. The lifting support 60 may support the workpiece in a way to hold the workpiece by suction instead of holding the workpiece by pads made of elastomer. The example lifting support 60 illustrated in FIG. 2 includes three tip portions 65, but in other examples the lifting support includes two tip portions 65 or four or more tip portions 65.

The lifting actuator 70 lifts and lowers the lifting support 60 (liftable unit 69). For example, the lifting actuator 70 is provided on the upper surface of the base 34 and supports the bottom portion 63 of the lifting support 60. The lifting actuator 70 is, for example, an actuator that moves (lifts) the lifting support 60 along the central axis Ax4 by a power source including an air cylinder. When the lifting support 60 is moved up and down by the lifting actuator 70, the tip portions 65 (the third pads 66 and the fourth pads 68) are moved up and down.

The lifting actuator 70 moves the lifting support 60 along the central axis Ax4 so as to switch between a state (first operating state) in which the rotational support 40 supports the substrate W1 and a state (second operating state) in which the lifting support 60 supports the substrate W1. The lifting actuator 70 moves the lifting support 60 along the central axis Ax4 so as to switch between a state (third operating state) in which the rotational support 40 supports the focus ring W2 and a state (fourth operating state) in which the lifting support 60 supports the focus ring W2. For example, the lifting actuator 70 lifts and lowers the lifting support 60 between a height position where the tip portion 65 of the lifting support 60 is positioned higher than the rotational arm 44 (the distal end portion 44c) and a height position where the tip portion 65 is positioned lower than the rotational arm 44 (the distal end portion 44c).

Figure 5A:
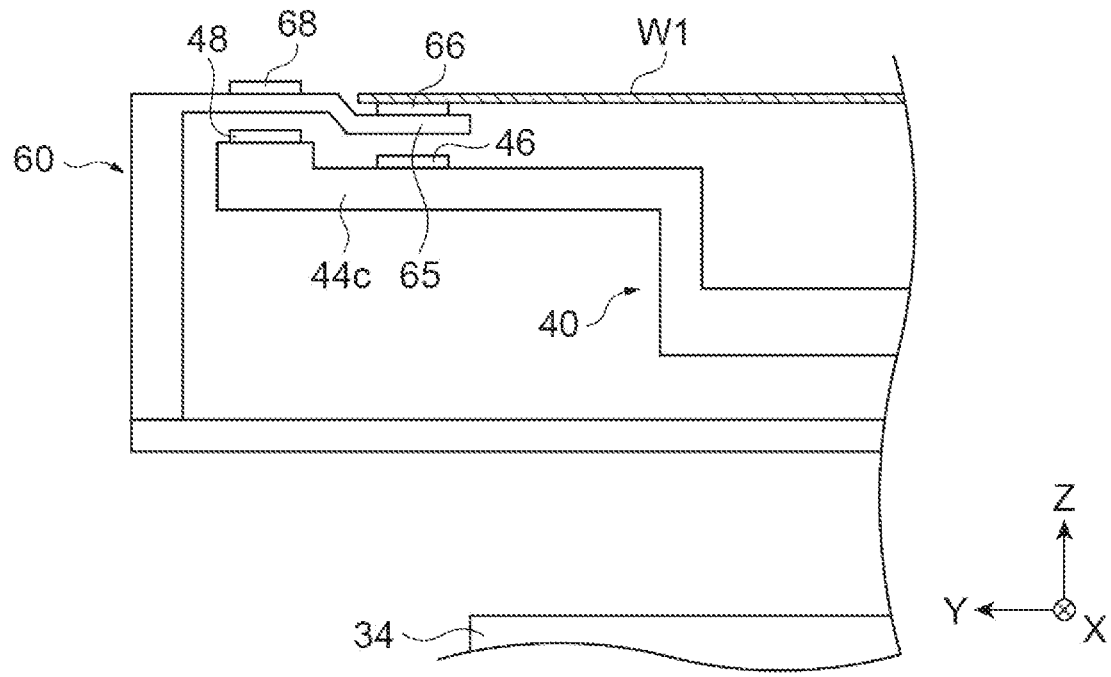
FIG. 5A is a schematic view illustrating an example operation for switching states of holding a substrate.
Figure 5B:
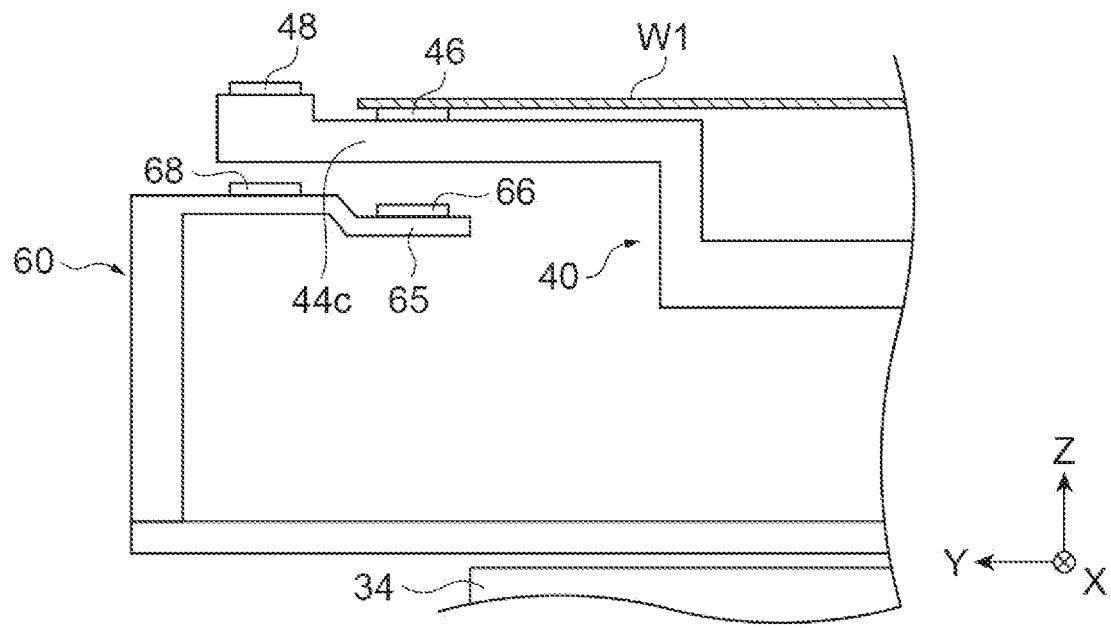
FIG. 5B is a further schematic view illustrating an example operation for switching states of holding a substrate.

FIG. 5A illustrates a case where the workpiece to be transported is the substrate W1 and the tip portion 65 is positioned above the distal end portion 44c. When the tip portion 65 is positioned above the distal end portion 44c, the lifting support 60 (the third pads 66s on the tip portions 65) supports the substrate W1. At this height position, the substrate W1 is transferred between the lifting support 60 and the transfer robot 12 of the robot apparatus 10. FIG. 5B illustrates a case where the workpiece to be transported is the substrate W1 and the tip portion 65 is positioned below the distal end portion 44c. When the tip portion 65 is positioned below the distal end portion 44c, the rotational support 40 (the first pads 46 on the distal end portions 44c) supports the substrate W1.

Figure 6A:
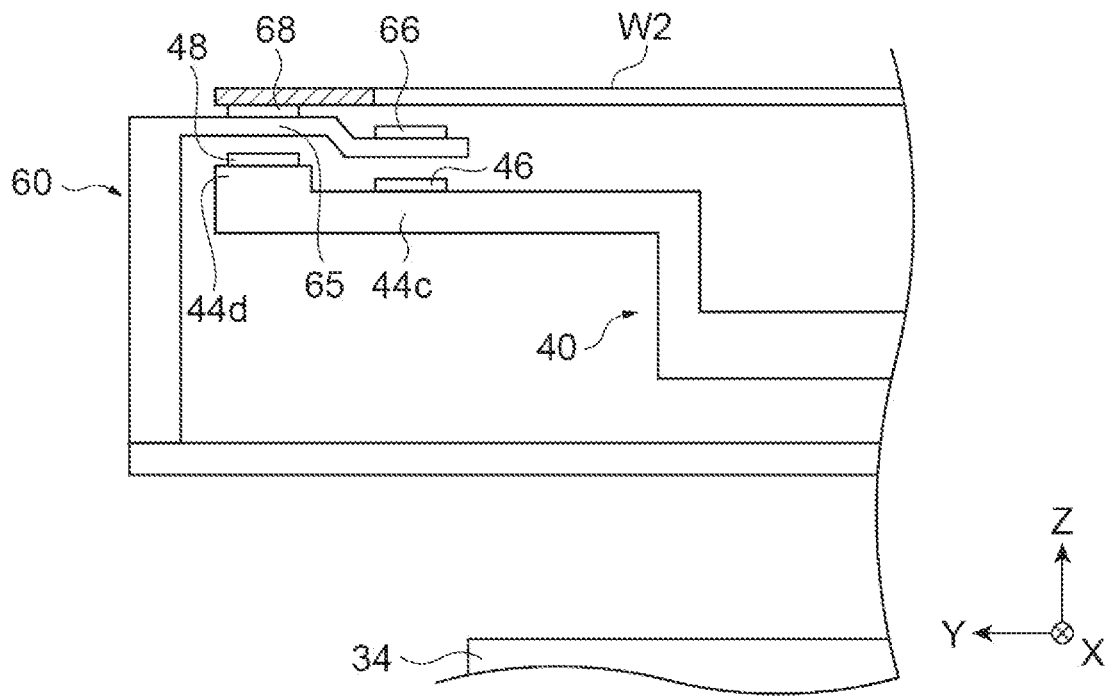
FIG. 6A is a schematic view illustrating an example operation for switching states of holding a focus ring.
Figure 6B:
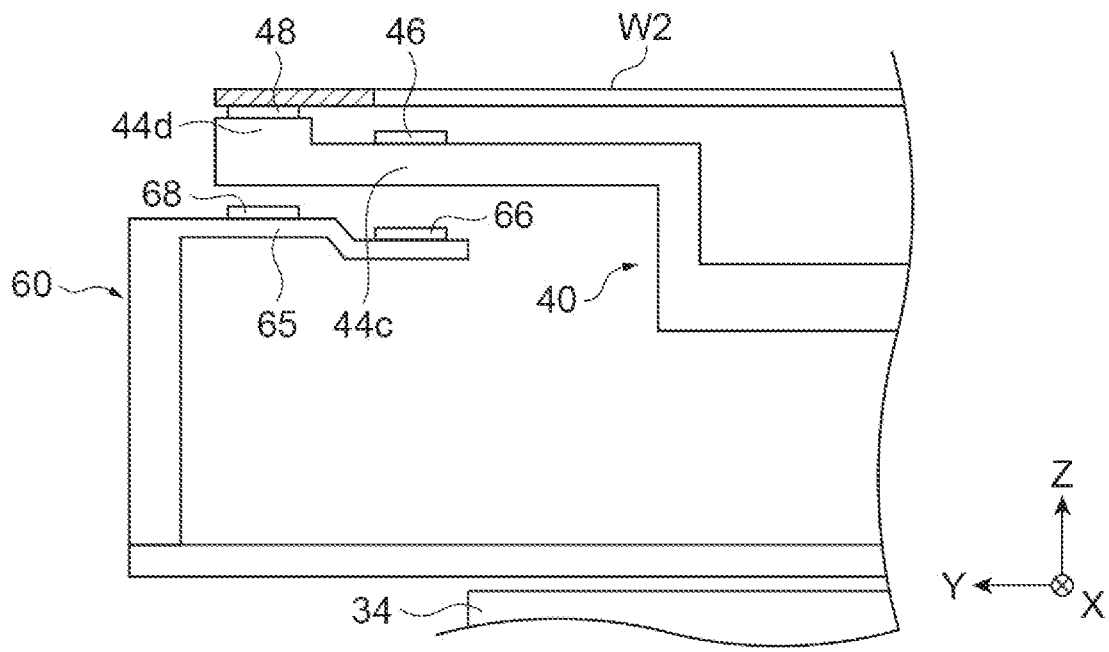
FIG. 6B is a further schematic view illustrating an example operation for switching states of holding a focus ring.

FIG. 6A illustrates a case where the workpiece to be transported is the focus ring W2 and the tip portion 65 is positioned above the distal end portion 44c (the protruding portion 44d). When the tip portion 65 is positioned above the distal end portion 44c, the lifting support 60 (the fourth pads 68 on the tip portions 65) supports the focus ring W2. At this height position, the focus ring W2 is transferred between the lifting support 60 and the transfer robot 12. FIG. 6B illustrates a case where the workpiece to be transported is the focus ring W2 and the tip portion 65 is positioned below the distal end portion 44c. When the tip portion 65 is positioned below the distal end portion 44c, the rotational support 40 (the second pads 48 on the protruding portions 44d) supports the focus ring W2.

As shown in FIG. 2, the edge sensor 90 is provided at least at one position in a circumference around the central axis Ax4 to detect an edge position of the substrate W1 supported by the plurality of first pads 46 and an edge position of the focus ring W2 supported by the plurality of second pads 48. For example, the edge sensor 90 is disposed between adjacent positions P4 (between adjacent positions P3) on a circumference around the central axis Ax4. The edge sensor 90 detects, as the edge position of the substrate W1 or the focus ring W2, an edge position in a radial direction of a circumference around the central axis Ax4. The edge sensor 90 may generate an edge signal that changes in accordance with each of the edge position of the substrate W1 supported by the first substrate supports 41 and the edge position of the focus ring W2 supported by the first ring supports 42. The edge sensor 90 may generate the edge signal by irradiating light to an irradiation region extending in a radial direction of a circumference around the central axis Ax4. A distance between an inner end of the irradiation region and the central axis Ax4 may be smaller than half of the outer diameter of the substrate W1 and be also smaller than half of the inner diameter of the focus ring W2. A distance between an outer end of the irradiation region and the central axis Ax4 may be greater than half of the outer diameter of the substrate W1 and be also greater than half of the inner diameter of the focus ring W2.

Figure 7A:
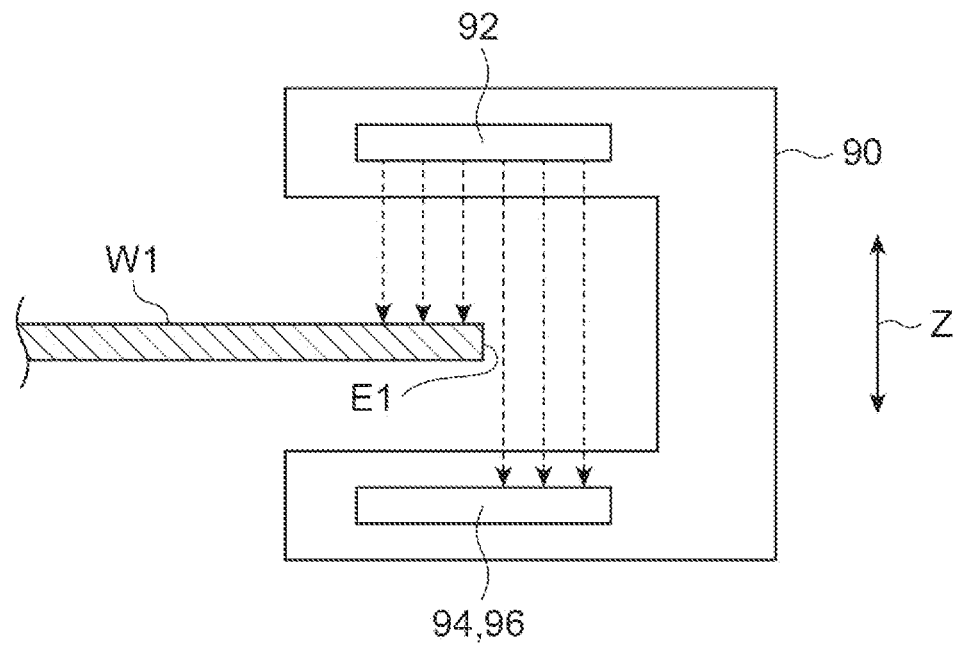
FIG. 7A is a side view of an example edge sensor.
Figure 7B:
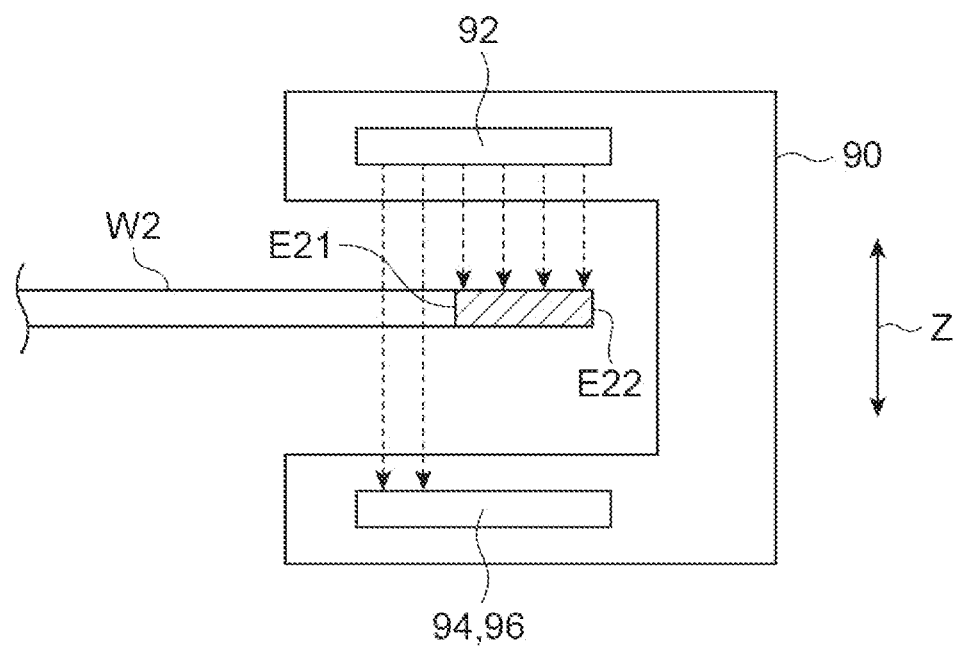
FIG. 7B is another side view of the edge sensor illustrated in FIG. 7A.

The edge sensor 90 includes, for example, an irradiation unit 92 (irradiation section) and a light receiving unit 94 (light receiving section). The irradiation unit 92 and the light receiving unit 94 sandwich each of the substrate W1 on the first pads 46 and the focus ring W2 on the second pads 48 in the vertical direction. As shown in FIGS. 7A and 7B, the irradiation unit 92 may be disposed above each of the substrate W1 and the focus ring W2, and the light receiving unit 94 may be disposed below each of the substrate W1 and the focus ring W2. The irradiation unit 92 includes a light source that irradiates with light the irradiation region extending along the radial direction of the circumference the center of which coincides with the central axis Ax4. The light receiving unit 94 is disposed to oppose (face) the irradiation unit 92. The light receiving unit 94 receives the light from the irradiation unit 92. The edge sensor 90 may generate the edge signal based on the light received from the irradiation unit 92.

The light receiving unit 94 may be a line sensor 96 having a plurality of light receiving elements arranged in a row along the radial direction of the circumference centered on the central axis Ax4. For example, the line sensor 96 is a CCD (Charge Coupled Device) line sensor. Each light receiving element included in the line sensor 96 generates a signal (detection signal) in accordance with an amount of incident light. The irradiation unit 92 and the light receiving unit 94 are provided to overlap each of the edge of the substrate W1 and the edge of the focus ring W2 supported by the rotational support 40 in plan view. In this case, a part of the light emitted from the irradiation unit 92 toward the light receiving unit 94 is blocked by each of the substrate W1 and the focus ring W2. The line sensor 96 may be configured to perform scanning in a direction from the inner side to the outer side around the central axis Ax4, and generate and output the detection signal in accordance with an amount of incident light to each of light receiving elements.

The edge sensor 90 may detect the outer peripheral edge E1 of the substrate W1 as the edge position of the substrate W1. As shown in FIG. 4A, the outer peripheral edge E1 whose position is to be detected may include a first indicator Id1. For example, the first indicator Id1 is a notch. The edge sensor 90 may detect the inner peripheral edge E21 of the focus ring W2 as the edge position of the focus ring W2. As shown in FIG. 4B, the inner peripheral edge E21 whose position is to be detected may include a second indicator Id2. For example, the second indicator Id2 is an orientation flat. The first indicator Id1 is provided to adjust the posture of the substrate W1 in the horizontal direction (the posture around the center position of the substrate W1). The second indicator Id2 is provided to adjust the posture of the focus ring W2 in the horizontal direction (the posture around the center position of the focus ring W2).

The alignment controller 130 controls the posture adjustment unit 32 to adjust the posture of the substrate W1 and to calculate the center position of the substrate W1 when the workpiece to be transported is the substrate W1. The alignment controller 130 controls the posture adjustment unit 32 to adjust the posture of the focus ring W2 and to calculate the center position of the focus ring W2 when the workpiece to be transported is the focus ring W2. The alignment controller 130 may detect each of the edge position of the substrate W1 and the edge position of the focus ring W2 based on a workpiece information and the edge signal. Hereinafter, an example of the configuration of the alignment controller 130 and the robot controller 110 of the robot apparatus 10 will be described.

Figure 8:
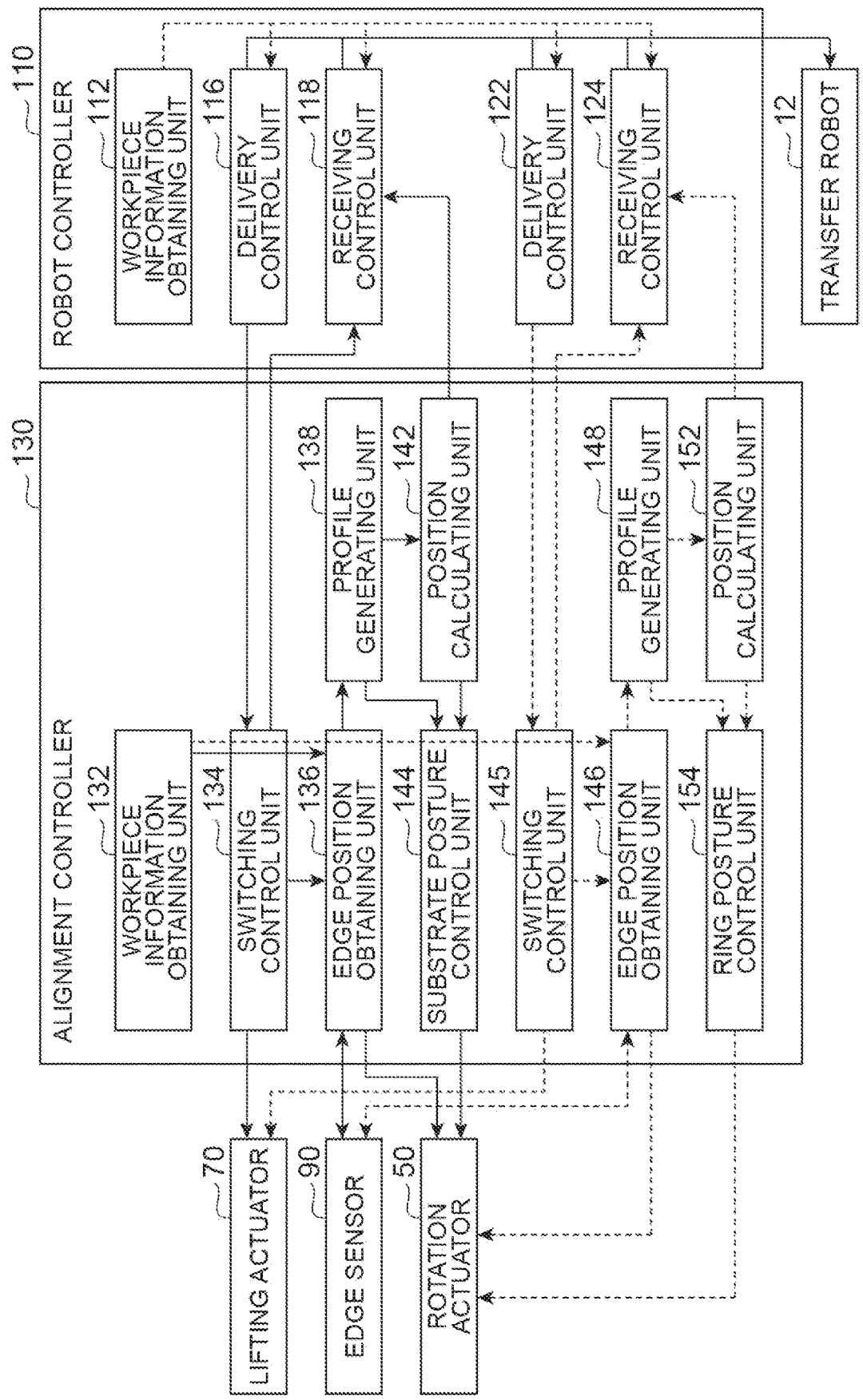
FIG. 8 is a block diagram illustrating an example functional configuration of a controller.

As shown in FIG. 8, the alignment controller 130 may include, as functional configurations (hereinafter referred to as "functional modules"), the workpiece information obtaining unit 132, the first switching control unit 134, the first edge position obtaining unit 136, the first profile generating unit 138, the first position calculating unit 142, the substrate posture control unit 144, the second switching control unit 145, the second edge position obtaining unit 146, the second profile generating unit 148, the second position calculating unit 152, and the ring posture control unit 154. Processing executed by each of these functional modules corresponds to processing executed by the alignment controller 130.

The workpiece information obtaining unit 132 obtains the workpiece information about the workpiece to be transported. The alignment controller 130 obtains the workpiece information from the outside. The workpiece information obtaining unit 132 obtains the workpiece information from, for example, a host controller included in the substrate processing apparatus. The workpiece information may include type information indicating a type of the workpiece and target posture information indicating a target posture of the workpiece. The type information indicates whether the workpiece to be conveyed is the substrate W1 or the focus ring W2. The target posture information may include information indicating target positions of the first indicator Id1 and the second indicator Id2 in a circumferential direction around the central axis Ax4 as the target posture of the workpiece.

The first switching control unit 134 controls the lifting actuator 70 to switch between a state in which the rotational support 40 supports the substrate W1 and a state in which the lifting support 60 supports the substrate W1 when the workpiece to be transported is the substrate W1. For example, when the second substrate supports 61 of the lifting support 60 support the substrate W1, the first switching control unit 134 controls the lifting actuator 70 so that the substrate supports 61 descend below the first substrate supports 41 of the rotational support 40 to switch to the state in which the first substrate supports 41 supports the substrate W1. When the first substrate supports 41 support the substrate W1, the first switching control unit 134 controls the lifting actuator 70 such that the second substrate supports 61 rise above the first substrate supports 41 to switch to the state in which the second substrate supports 61 supports the W1.

The first edge position obtaining unit 136 obtains the detection result of the edge position of the substrate W1 (the position of the outer peripheral edge E1) when the workpiece to be transported is the substrate W1. For example, the first edge position obtaining unit 136 obtains the detection result of the position of the outer peripheral edge E1 from the edge sensor 90 at predetermined rotation angles around the central axis Ax4 while rotating the rotational support 40 (substrate W1) around the central axis Ax4 by the rotation actuator 50. For example, the first edge position obtaining unit 136 rotates the substrate W1 around the central axis Ax4 by one or more turns by controlling the rotation actuator 50. The first edge position obtaining unit 136 obtains the edge position by identifying a position of a light receiving element at which an amount of change in signal intensity is equal to or greater than a predetermined value in a detection signal obtained with the edge sensor 90 scanning from the inner side toward the outer side along a radial direction of a circumference centered on the central axis Ax4. When scanning from the inner side toward the outer side along the radial direction, the first edge position obtaining unit 136 may detect the edge position of the substrate W1 by identifying a first transition from where the light is blocked by the substrate W1 to where the light is not blocked by the substrate W1. When scanning from the outer side toward the inner side along the radial direction, the first edge position obtaining unit 136 may detect the edge position of the substrate W1 by identifying a third transition (first transition) from where the light is not blocked by the substrate W1 to where the light is blocked by the substrate W1.

Figure 9:
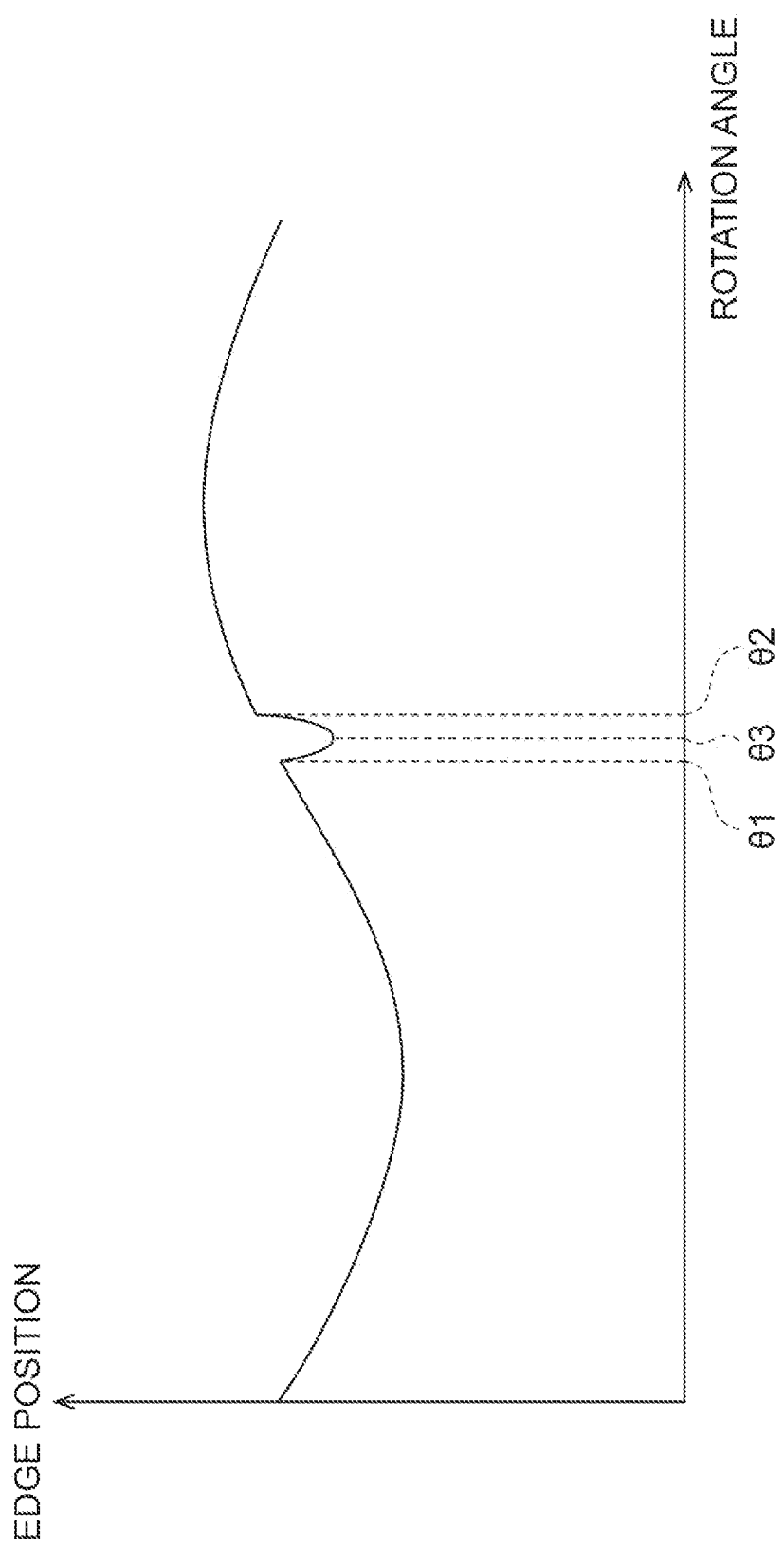
FIG. 9 is a graph of an example edge profile.

The first profile generating unit 138 generates a substrate edge profile based on the edge position of the substrate W1 detected by the edge sensor 90 while the rotation actuator 50 is rotating the rotational support 40. The substrate edge profile indicates a relationship between an angle of rotation of the rotational support 40 about the central axis Ax4 and the edge position of the substrate W1. FIG. 9 illustrates the substrate edge profile. With the graph shown in FIG. 9, the horizontal axis represents the angle of rotation and the vertical axis represents the edge position (the position of the outer peripheral edge E1). As shown in FIG. 9, in the substrate edge profile, the edge position may vary in a curved shape as a whole with respect to the angle of rotation due to a deviation between the center position of the substrate W1 and the central axis Ax4. The presence of the first indicator Id1 may cause a portion of the curve of the edge positions to exhibit a tendency different from the overall varying tendency.

The first position calculating unit 142 calculates the center position of the substrate W1 in the rotational support 40 based on the substrate edge profile. The center position of the substrate W1 in the rotational support 40 is the position of the center of the substrate W1 supported by the first support firsts 41 (for example, the first pads 46) of the rotational support 40. The first position calculating unit 142 may calculate the center position of the substrate W1 using various methods. For example, the first position calculating unit 142 calculates the center position in the following procedure. First, the first position calculating unit 142 calculates variation in the edge position for each of predetermined rotation angles. The first position calculating unit 142 assumes a region including the rotation angles at which the variation is equal to or greater than a predetermined value as a region where the first indicator Id1 is present. In the example illustrated in FIG. 9, it is assumed that a region between the rotation angles θ1 and θ2 is a region where the first indicator Id1 exists.

Then, the first position calculating unit 142 extracts a plurality of edge positions arranged at equal angular intervals as representative points from the first edge profile after excluding the region in which the substrate indicator Id1 is assumed to be present. The first position calculating unit 142 calculates, using the plurality of representative points, the center position (geometric center position) of the substrate edge profile after excluding the assumed region in which the first indicator Id1 is present. The calculated center position of the substrate edge profile corresponds to the center position of the substrate W1 in the rotational support 40.

The substrate posture control unit 144 controls the rotation actuator 50 to adjust the posture of the substrate W1 around the central axis Ax4 to the target posture (first target posture) based on the edge position of the substrate W1 detected by the edge sensor 90. The substrate posture control unit 144 may detect the first indicator Id1 based on the edge signal. The substrate posture control unit 144 may detect the first indicator Id1 (for example, detect the position of the first indicator Id1 in the circumferential direction around the central axis Ax4) based on the above-described substrate edge profile indicating the position of the outer peripheral edge E2 of the substrate W1 detected by the edge sensor 90.

The substrate posture control unit 144 may detect the first indicator Id1 using various methods. For example, the substrate posture control unit 144 obtains the difference between the substrate edge profile and a theoretical value of the edge position of the substrate W1 (an edge position when the substrate indicator Id1 is assumed to be absent). The theoretical value of the edge position of the substrate W1 is obtained from the calculation result of the center position of the substrateW1 in the rotational support 40. Then, the substrate posture control unit 144 determines the region where the first indicator Id1 is present by identifying a region where the difference is equal to or larger than a predetermined value. Thereafter, the substrate posture control unit 144 performs parabolic approximation or the like on the first edge profile of the region where the first indicator Id1 is present, and calculates an angle of rotation of the deepest portion (the position closest to the center) as an angular position of the first indicator Id1. In the example shown in FIG. 9, an angle of rotation θ3 is calculated as the angular position of the first indicator Id1.

After the first indicator Id1 is detected, the substrate posture control unit 144 controls the rotation actuator 50 to adjust the first indicator Id1 to the target position (first target position) corresponding to the target posture of the substrate W1. For example, the substrate posture control unit 144 controls the rotation actuator 50 to bring the position (angular position) of the first indicator Id1 in the circumferential direction around the central axis Ax4 close to the target position indicated by the target posture information.

The second switching control unit 145 controls the lifting actuator 70 to switch between a state in which the rotational support 40 supports the focus ring W2 and a state in which the lifting support 60 supports the focus ring W2 when the workpiece to be transported is the focus ring W2. For example, when the second ring supports 62 of the lifting support 60 support the focus ring W2, the second switching control unit 145 controls the lifting actuator 70 such that the second ring supports 62 descend below the first ring supports 42 of the rotational support 40 to switch to the state in which the ring supports 42 support the focus ring W2. When the first ring supports 42 support the focus ring W2, the second switching control unit 145 controls the lifting actuator 70 such that the second ring supports 62 are lifted above the first ring supports 42 to switch to the state in which the second ring supports 62 support the focus ring W2.

The second edge position obtaining unit 146 obtains the detection result of the edge position of the focus ring W2 (for example, the position of the inner peripheral edge E21) when the workpiece to be conveyed is the focus ring W2. The second edge position obtaining unit 146 may obtain the detection result of the position of the inner circumferential edge E21 from the edge sensor 90 for each of predetermined rotation angles around the central axis Ax4 while the rotational support 40 (focus ring W2) is rotating around the central axis Ax4 by the rotation actuator 50. For example, the second edge position obtaining unit 146 rotates the focus ring W2 around the central axis Ax4 by one or more turns by controlling the rotation actuator 50. The second edge position obtaining unit 146 obtains the edge position by identifying a position of a light-receiving element at which a variation in signal intensity is equal to or greater than a predetermined value in the detection signal obtained with the edge sensor 90 scanning from the inner side toward the outer side along the radial direction of the circumference centered on the central axis Ax4. When scanning from the inner side toward the outer side along the radial direction, the second edge position obtaining unit 146 may detect the edge position of the focus ring W2 by identifying a second transition from where the light is not blocked by the focus ring W2 to where the light is blocked by the focus ring W2. The second transition is opposite from the first transition which is identified to detect the edge of substrate W1. When scanning from the outer side toward the inner side along the radial direction, the second edge position obtaining unit 136 may detect the edge position of the focus ring W2 by identifying a fourth transition (second transition) from where the light is blocked by the focus ring W2 to where the light is not blocked by the focus ring W2. The fourth transition is opposite from the third transition which is identified to detect the edge of substrate W1.

The second profile generating unit 148 generates a ring edge profile based on the edge position of the focus ring W2 detected by the edge sensor 90 while the rotation actuator 50 is rotating the rotational support 40. The ring edge profile indicates the relationship between the angle of rotation of the rotational support 40 around the central axis Ax4 and the edge position of the focus ring W2. In the ring edge profile, similarly to the substrate edge profile, the edge position may vary in a curved shape as a whole due to the deviation between the center position of the focus ring W2 and the central axis Ax4. The presence of the second indicator Id2 may cause a portion of the curve of the edge position to exhibit a tendency different from the overall varying tendency.

The second position calculating unit 152 calculates the center position of the focus ring W2 in the rotational support 40 based on the ring edge profile. The center position of the focus ring W2 in the rotational support 40 is the center position of the focus ring W2 supported by the first ring supports 42 (for example, the second pads 48) of the rotational support 40. The second position calculating unit 152 may calculate the center position of the focus ring W2 using various methods. For example, the second position calculating unit 152 may calculate the center position of the focus ring W2 in the similar manner as the first position calculating unit 142 calculates the center position of the substrate W1.

The ring posture control unit 154 controls the rotation actuator 50 to adjust the posture of the focus ring W2 around the central axis Ax4 to the target posture (second target posture) based on the edge position of the focus ring W2 detected by the edge sensor 90. The ring posture control unit 154 may detect the second indicator Id2 based on the edge signal. The ring posture control unit 154 may detect the second indicator Id2 based on, for example, the above-described ring edge profile indicating the position of the inner peripheral edge E21 of the focus ring W2 detected by the edge sensor 90. The ring posture control unit 154 may calculate the position of the second indicator Id2 in the circumferential direction around the central axis Ax4. The ring posture control unit 154 may detect the second indicator Id2 using various methods. For example, the ring posture control unit 154 may detect the second indicator Id2 in the similar manner as the first posture controller 144 detects the first indicator Id1.

After the second indicator Id2 is detected, the ring posture control unit 154 controls the rotation actuator 50 to adjust the second indicator Id2 to a target position (second target position) corresponding to the target posture of the focus ring W2. The ring posture control unit 154 controls the rotation actuator 50 to bring the position (angular position) of the second indicator Id2 in the circumferential direction around the central axis Ax4 close to the target position indicated by the above-described target posture information.

The robot controller 110 includes, as functional modules, a workpiece information obtaining unit 112, a first delivery control unit 116, a first receiving control unit 118, a second delivery control unit 122, and a second receiving control unit 124. Processing executed by these functional modules corresponds to processing executed by the robot controller 110.

Similarly to the workpiece information obtaining unit 132 of the alignment controller 130 described above, the workpiece information obtaining unit 112 obtains information (the workpiece information described above) about the workpiece to be transported from the outside of the robot controller 110. The workpiece information obtaining unit 112 obtains the workpiece information from, for example, the host controller provided in the substrate processing apparatus. One of the workpiece information obtaining unit 112 and the workpiece information obtaining unit 132 may obtain the workpiece information from the host controller and output the workpiece information to the other. For example, the workpiece information obtaining unit 112 may obtain the workpiece information from the host controller and output the workpiece information to the workpiece information obtaining unit 132.

The substrate delivery control unit 116 controls the transfer robot 12 so that the substrate W1 is delivered from the hand 14 of the transfer robot 12 to the alignment apparatus 30 when the workpiece to be transported is the substrate W1. For example, the first delivery control unit 116 controls the transfer robot 12 so that the hand 14 holds the substrate W1 before processing. Then, the first delivery control unit 116 controls each actuator of the transfer robot 12 so that the substrate W1 is placed on the lifting support 60 from the hand 14 in a state where the second substrate supports 61 of the lifting support 60 are positioned above the first substrate supports 41 of the rotational support 40 in the alignment apparatus 30. The first delivery control unit 116 may control each actuator of the transfer robot 12 such that the relative position of the hand 14 with respect to the lifting support 60, when each substrate W1 is transferred from the hand 14 to the lifting support 60, is substantially constant among the plurality of substrates W1 that are sequentially transported.

The substrate receiving control unit 118 adjusts the position of the hand 14 based on the calculation result of the center position of the substrate W1 and controls the transfer robot 12 so that the hand 14 supports and conveys the received substrate W1 when the workpiece to be conveyed is the substrate W1. For example, the first receiving control unit 118 adjusts the position of the hand 14 in the horizontal direction so that a difference between the center position of the substrate W1 and a reference position of the hand 14 approaches zero in accordance with a deviation between the calculation result of the center position of the substrate W1 and the central axis Ax4. The reference position of the hand 14 coincides with the center position of the substrate W1 when a holding state of the substrate W1 held by the hand 14 is the ideal state.

The position of the hand 14 to be adjusted is a relative position between the lifting support 60 and the hand 14 when (or immediately before) the hand 14 receives the substrate W1 from the lifting support 60.

The center position of the substrate W1 is not varied in the operation of transferring the substrate W1 between the rotational support 40 and the lifting support 60, because the lifting support 60 is moved in the direction along the central axis Ax4. The center position of the substrate W1 in the lifting support 60 corresponds to (or substantially coincides with) the center position of the substrate W1 in the rotational support 40. In a state where the position of the hand 14 has been adjusted, for example, the first receiving control unit 118 may control each actuator of the transfer robot 12 so that the hand 14 lifts up the substrate W1 supported by the lifting support 60.

The center position of the substrate W1 may be calculated before the posture of the substrate W1 is adjusted (for example, before the position of the first indicator Id1 in the circumferential direction is adjusted to the target position). After the position of the first indicator Id1 in the circumferential direction is adjusted to the target position, the center position of the substrate W1 also may change. The first receiving control unit 118 may correct the center position calculated before the adjustment of the posture in accordance with the rotation amount associated with the posture adjustment. The first receiving controller 118 may adjust the position of the hand 14 based on the corrected center position of the substrate W1.

The second delivery control unit 122 controls the transfer robot 12 so that the focus ring W2 is delivered from the hand 14 of the transfer robot 12 to the alignment apparatus 30 when the workpiece to be transported is the focus ring W2. For example, the second delivery control unit 122 controls the transfer robot 12 so that the hand 14 holds the focus ring W2 before using. Then, the second delivery control unit 122 controls each actuator of the transfer robot 12 so that the focus ring W2 is placed from the hand 14 to the lifting support 60 in a state where the lifting support 60 is positioned above the rotational support 40 in the alignment apparatus 30. When the focus ring W2 is transferred from the hand 14 to the lifting support 60 (or immediately before the focus ring W2 is transferred), the second delivery control unit 122 may control the actuators of the transfer robot 12 such that the relative position of the hand 14 with respect to the lifting support 60 is substantially constant during the repeatedly performed transfer operation.

The second receiving control unit 124 adjusts the position of the hand 14 based on the calculation result of the center position of the focus ring W2, and controls the transfer robot 12 such that the hand 14 supports and conveys the received focus ring W2 when the workpiece to be transported is the focus ring W2. For example, the second receiving control unit 124 adjusts the position of the hand 14 in the horizontal direction in accordance with the deviation between the central axis Ax4 and the calculation result of the center position of the focus ring W2 so that a difference between the center position of the focus ring W2 and a reference position of the hand 14 approaches zero when the hand 14 holds the focus ring W2. The reference position of the hand 14 coincides with the center position of the focus ring W2 when the holding state of the focus ring W2 held by the hand 14 is an ideal state.

The position of the hand 14 to be adjusted is a relative position between the lifting support 60 and the hand 14 when (or immediately before) the hand 14 receives the focus ring W2 from the lifting support 60. The center position of the focus ring W2 is not varied in the operation of transferring the focus ring W2 between the rotational support 40 and the lifting support 60, because the lifting support 60 is moved in the direction along the central axis Ax4. The center position of the focus ring W2 in the lifting support 60 corresponds to (or substantially coincides with) the center position of the focus ring W2 in the rotational support 40. The second receiving control unit 124 may control each actuator of the transfer robot 12 so that the hand 14 lifts up the focus ring W2 supported by the lifting support 60 in a state where the position of the hand 14 has been adjusted.

The center position of the focus ring W2 may be calculated before the posture of the focus ring W2 is adjusted (for example, before the position of the second indicator Id2 in the circumferential direction is adjusted to the target position). After the position (angular position) of the second indicator Id2 in the circumferential direction is adjusted to the target position, the center position of the focus ring W2 also may change. The second receiving control unit 124 may correct the center position calculated before the adjustment of the posture in accordance with the rotation amount associated with the posture adjustment. The second receiving controller 124 may adjust the position of the hand 14 based on the corrected center position of the focus ring W2.

Figure 10:
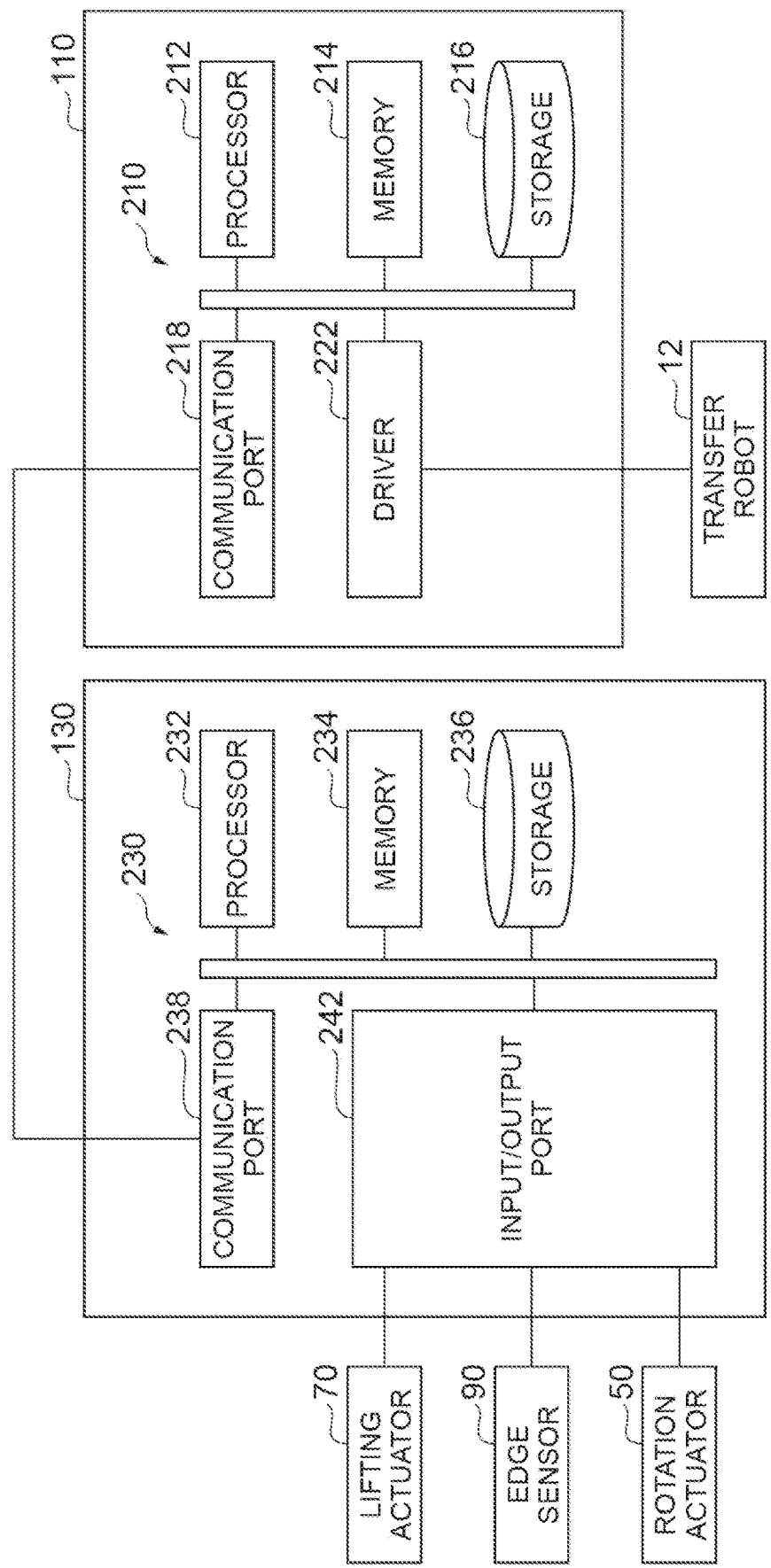
FIG. 10 is a block diagram illustrating an example hardware configuration of a controller.

As shown in FIG. 10, the alignment controller 130 includes circuitry 230. The circuitry 230 includes at least one processor 232, a memory 234, a storage 236, a communication port 238, and an input/output port 242. The storage 236 is a non-volatile computer-readable storage medium (for example, a flash memory). The storage 236 stores a program and some data for controlling the posture adjustment unit 32 to adjust the posture of each of the substrate W1 and the focus ring W2 and to calculate the center position of each of the substrate W1 and the focus ring W2.

The memory 234 temporarily stores a program loaded from the storage 236, an operation result by the processor 232, and the like. The processor 232 executes the program in cooperation with the memory 234 to configure the functional modules of the alignment controller 130. The storage 236 may be a non-transitory memory device having instructions stored thereon that, in response to execution by the processor 232 (processing device), cause the processor 232 to perform the operations, which may be executed by the functional modules. The input/output port 242 inputs and outputs electrical signals to and from the rotation actuator 50, the lifting actuator 70, the edge sensor 90, and the like in response to a command from the processor 232. The communication port 238 communicates with the robot controller 110 in a wireless or wired manner in response to a command from the processor 232.

The robot controller 110 includes circuitry 210. The circuitry 210 includes at least one processor 212, a memory 214, a storage 216, a communication port 218, and a driver 222. The storage 216 is a non-volatile computer-readable storage medium (for example, a flash memory). The storage 216 stores a program and some data for controlling the transfer robot 12 to transport each of the substrate W1 and the focus ring W2 between the transfer robot 12 and the posture adjustment unit 32.

The memory 214 temporarily stores a program loaded from the storage 216, an operation result by the processor 212, and the like. The processor 212 configures the functional modules of the robot controller 110 by executing the program in cooperation with the memory 214. The driver 222 outputs driving power to each actuator of the transfer robot 12 in response to a command from the processor 212. The communication port 218 communicates with the alignment controller 130 in a wireless or wired manner in response to a command from the processor 212.

It should be noted that the robot controller 110 and the alignment controller 130 are not necessarily limited to those having respective functions configured by programs. For example, at least a part of the functions of the robot controller 110 and the alignment controller 130 may be configured by a dedicated logic circuit or an application specific integrated circuit (ASIC) in which the dedicated logic circuit is integrated. The robot controller 110 (circuitry 210) and the alignment controller 130 (circuitry 230) may be housed in different housings or may be housed in the same housing. The robot controller 110 and the alignment controller 130 constitute a controller system (control system) in the transport system 1. The transport system 1 may include a single controller (a single circuitry) having the same function as the robot controller 110 and the same function as the alignment controller 130 instead of the robot controller 110 and the alignment controller 130. The functional modules included in the one controller for controlling the posture adjustment unit 32 and the posture adjustment unit 32 constitute an alignment apparatus.

Transport Method

Next, an example substrate transport method, or transport procedure, executed by the robot controller 110 and the alignment controller 130 will be described. This transport procedure includes an alignment procedure (alignment method) executed by the alignment controller 130. The alignment procedure included in the transport procedure includes detecting the edge position of the substrate W1 supported by the rotational support 40 at the positions P1 surrounding the central axis Ax4 with the edge sensor 90 provided at least at one position around the central axis Ax4, and rotating the rotational support 40 around the central axis Ax4 to adjust the posture of the substrate W1 around the central axis Ax4 to the first target posture based on the edge position of the substrate W1 detected by the edge sensor 90. The alignment procedure further includes detecting the edge position of the focus ring W2 supported by the rotational support 40 at positions P2 surrounding the central axis Ax4 with the edge sensor 90, and rotating the rotational support 40 around the central axis Ax4 to adjust the posture of the focus ring W2 around the central axis Ax4 to the second target posture based on the edge position of the focus ring W2 detected by the edge sensor 90.

Figure 11:
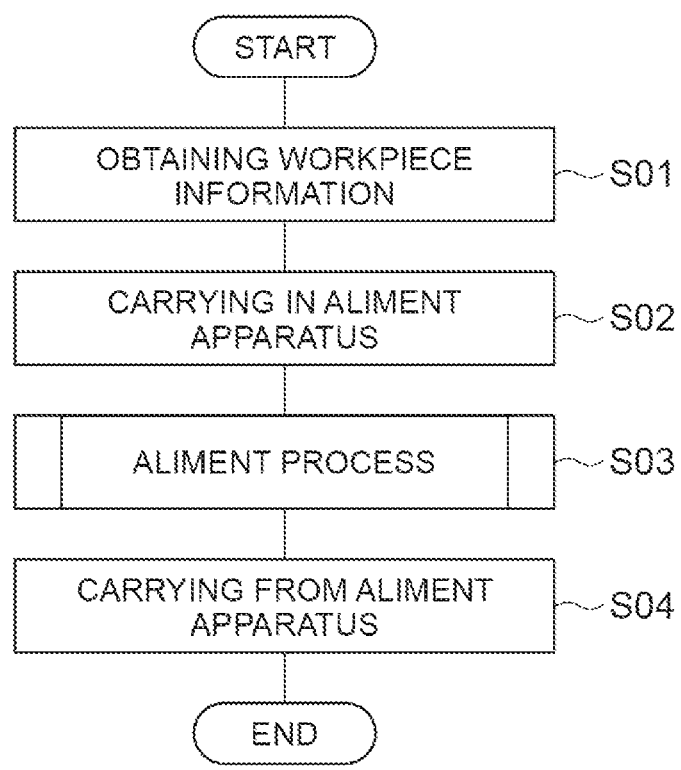
FIG. 11 is a flowchart illustrating an example transport procedure for a workpiece.

As shown in FIG. 11, the robot controller 110 first executes step S01. In step S01, for example, the workpiece information obtaining unit 112 and the workpiece information obtaining unit 132 obtain the workpiece information from the outside. In step S01 and subsequent steps, when the type of the workpiece indicated by the workpiece information is the substrate W1, a process for the substrate W1 is executed, and when the type of the workpiece is the focus ring W2, a process for the focus ring W2 is executed. In the following, an operation when the type of the workpiece is substrate W1 will be described first.

Next, the robot controller 110 executes step S02. In step S02, for example, the first delivery control unit 116 controls the transfer robot 12 to carry the substrate W1 into the alignment apparatus 30. For example, after the hand 14 holds the substrate W1 before processing, the first delivery control unit 116 controls the actuators of the transfer robot 12 so that the substrate W1 is delivered (placed) from the hand 14 to the lifting support 60.

Figure 12:
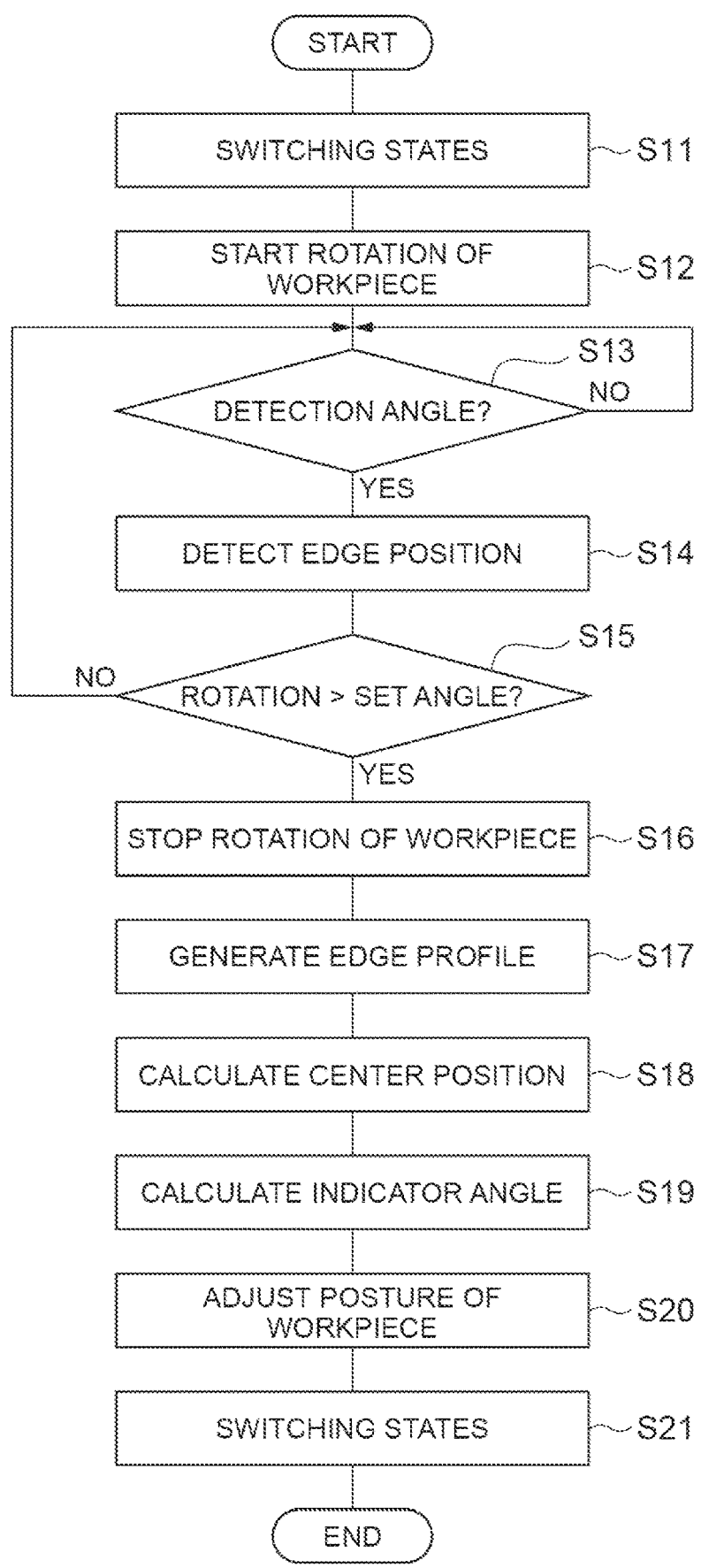
FIG. 12 is a flowchart illustrating an example alignment process for a workpiece.

Next, the alignment controller 130 executes step S03. In step S03, the alignment controller 130 performs an alignment process on the substrate W1. FIG. 12 is a flowchart illustrating the alignment process in step S03.

In the alignment process shown in FIG. 12, the alignment controller 130 first executes step S11. In step S11, for example, the first switching control unit 134 controls the lifting actuator 70 so that the second substrate supports 61 of the lifting support 60 supporting the substrate W1 is lowered below the first substrate supports 41 of the rotational support 40. Accordingly, the substrate W1 is transferred from the lifting support 60 to the rotational support 40.

Next, the alignment controller 130 executes steps S12 and S13. In step S12, for example, the first edge position obtaining unit 136 controls the rotation actuator 50 to start rotation of the rotational support 40 supporting the substrate W1 around the central axis Ax4. As a result, the substrate W1 starts to rotate around the central axis Ax4. In step S13, for example, the first edge position obtaining unit 136 waits until the angle of rotation of the substrate W1 reaches a predetermined detection angle. The detection angle is determined in advance in accordance with the number of detection points at each of which the edge position of the substrate W1 is detected.

Next, the alignment controller 130 executes steps S14 and S15. In step S14, for example, the first edge position obtaining unit 136 obtains the detection result of the position of the outer peripheral edge E1 of the substrate W1 at the detection angle from the edge sensor 90. In step S15, the first edge position obtaining unit 136 determines whether or not the rotational support 40 has been rotated by a preset angle or more. The preset angle is set at, for example, one or more turns (360° or more). In this case, the position of the edge is detected in the entire circumference of the substrate W1.

In step S15, when it is determined that the rotational support 40 is not rotated by the preset angle or more (step S15: NO), the process returns to step S13, and steps S13 to S15 are repeated. Thus, the position of the outer peripheral edge E1 of the substrate W1 is detected for each of the detection angles (for each of the rotation angles). On the other hand, in step S15, when it is determined that the rotating portion 40 has rotated by the preset angle or more (step S15: YES), the alignment controller 130 executes step S16. In step S16, for example, the first edge position obtaining unit 136 controls the rotation actuator 50 to stop the rotation of the rotational support 40 supporting the substrate W1 around the central axis Ax4. As a result, the rotation of the substrate W1 around the central axis Ax4 is stopped.

Next, the alignment controller 130 executes step S17. In step S17, for example, the first profile generating unit 138 generates, based on the edge position of the substrate W1 obtained by executing steps S12 to S15, the substrate edge profile indicating the relationship between the angle of rotation of the rotational support 40 around the central axis Ax4 and the edge position of the substrate W1.

Next, the alignment controller 130 executes steps S18 and S19. In step S18, for example, the first position calculating unit 142 calculates the center position of the substrate W1 in the rotational support 40 based on the substrate edge profile obtained in step S17. In step S19, for example, the substrate posture control unit 144 calculates the angular position (the position in the circumferential direction around the central axis Ax4) of the first indicator Id1 provided on the outer peripheral edge E1 of the substrate W1 based on the first edge profile obtained in step S17.

Next, the alignment controller 130 executes steps S20 and S21. In step S20, for example, the substrate posture control unit 144 control the rotation actuator 50 to rotate the rotational support 40 (substrate W1) so that the angular position of the first indicator Id1 calculated in step S19 is adjusted to the target position corresponding to the target orientation of the substrate W1. In step S21, for example, the first switching control unit 134 controls the lifting actuator 70 so that the second substrate supports 61 of the lifting support 60 are raised above the first substrate supports 41 of the rotational support 40 supporting the substrate W1. As a result, the substrate W1, whose posture has been adjusted to the target posture, is transferred from the rotational support 40 to the lifting support 60 while being maintained in the posture adjusted in step S20. Thus, the alignment process for the substrate W1 in step S03 is completed.

Next, the robot controller 110 executes step S04. In step S04, for example, the first receiving control unit 118 adjusts the position of the hand 14 based on the center position of the substrate W1 calculated in step S18, and controls the transfer robot 12 so that the hand 14 receives the substrate W1 from the alignment apparatus 30. For example, the first receiving control unit 118 corrects the center position calculated in step S18 in accordance with the rotation amount for posture adjustment in step S20. Then, the first receiving control unit 118 adjusts, based on the corrected center position, the position of the hand 14 in the horizontal direction by each actuator of the transfer arm 16 so that the holding state of the substrate W1 when the hand 14 receives the substrate W1 approaches the ideal state. After the hand 14 receives the substrate W1, the first receiving control unit 118 controls the transfer robot 12 so that the hand 14 supports and conveys the substrate W1 toward a predetermined position. When the substrate W1 is carried into the predetermined position, the adjustment of the center position of the substrate W1 may be completed. Thus, the transfer procedure for one substrate W1 (one workpiece) is completed.

The processing in the case where the type of the workpiece is the focus ring W2 is executed in the similar manner as the above-described steps S02 to S04 and S11 to S21. In step S02, for example, the second delivery control unit 122 controls the transfer robot 12 to carry the focus ring W2 into the alignment apparatus 30. For example, the second delivery control unit 122 controls the actuators of the transfer robot 12 so that the focus ring W2 before using is held by the hand 14 and then delivered (placed) from the hand 14 to the lifting support 60.

In step S03, the alignment controller 130 performs an alignment process for the focus ring W2. In step S11 included in the alignment process of step S03, for example, the second switching control unit 145 controls the lifting actuator 70 so that the second ring supports 62 of the lifting support 60 supporting the focus ring W2 is lowered below the first ring supports 42 of the rotational support 40. Accordingly, the focus ring W2 is transferred from the lifting support 60 to the rotational support 40.

In step S12, for example, the second edge position obtaining unit 146 controls the rotation actuator 50 to start rotation of the rotational support 40 supporting the focus ring W2 around the central axis Ax4. Accordingly, the focus ring W2 starts to rotate around the central axis Ax4. In step S13, the second edge position obtaining unit 146 waits until the angle of rotation of the rotational support 40 reaches a predetermined detection angle. The detection angle is determined in advance in accordance with the number of detection points at each of which the edge position of the focus ring W2 is detected.

In step S14, for example, the second edge position obtaining unit 146 obtains the detection result of the position of the inner circumferential edge E21 of the focus ring W2 at each of the detection angles from the edge sensor 90. By executing steps S12 to S15, the position of the inner peripheral edge E21 of the focus ring W2 is detected for each of the detection angles (for each of the rotation angles). In step S16, for example, the second edge position obtaining unit 146 controls the rotation actuator 50 to stop the rotation of the rotational support 40 supporting the focus ring W2 around the central axis Ax4. As a result, the rotation of the focus ring W2 around the central axis Ax4 is stopped.

In step S17, for example, the second profile generating unit 148 generates, based on the edge positions of the focus ring W2 obtained by executing steps S12 to S15, the ring edge profile indicating the relationship between the angle of rotation of the rotational support 40 around the central axis Ax4 and the edge position of the focus ring W2. In step S18, for example, the second position calculating unit 152 calculates the center position of the focus ring W2 in the rotational support 40 based on the ring edge profile obtained in step S17. In step S19, for example, the ring posture control unit 154 calculates, based on the ring edge profile obtained in step S17, the angular position (the position in the circumferential direction around the central axis Ax4) of the second indicator Id2 provided on the inner circumferential edge E21 of the focus ring W2.

In step S20, for example, the ring posture control unit 154 controls the rotation actuator 50 to rotate the rotational support 40 (the focus ring W2) so that the angular position of the second indicator Id2 calculated in step S19 is adjusted to the target position corresponding to the target posture of the focus ring W2. In step S21, for example, the second switching control unit 145 controls the lifting actuator 70 so that the second ring supports 62 of the lifting support 60 are raised above the first ring supports 42 of the rotational support 40 supporting the focus ring W2. Accordingly, in a state where the focus ring W2 is maintained in the posture adjusted in step S20, the focus ring W2, whose posture has been adjusted to the target posture, is transferred from the rotational support 40 to the lifting support 60.

In step S04, for example, the second receiving control unit 124 adjusts the position of the hand 14 based on the center position of the focus ring W2 calculated in step S18, and controls the transfer robot 12 so that the hand 14 receives the focus ring W2 from the alignment apparatus 30. For example, the second receiving control unit 124 corrects the center position calculated in step S18 in accordance with the rotation amount for posture adjustment in step S20. Then, the second receiving control unit 124 adjusts, based on the corrected center position, the position of the hand 14 in the horizontal direction by each actuator of the transfer arm 16 so that the holding state of the focus ring W2 when the hand 14 receives the focus ring W2 approaches the ideal state. After the hand 14 receives the focus ring W2, the second receiving control unit 124 controls the transfer robot 12 so that the hand 14 supports and conveys the focus ring W2 toward a predetermined position. When the focus ring W2 is carried into the predetermined position, the adjustment of the center position of the focus ring W2 may be completed.

The robot controller 110 and the alignment controller 130 repeatedly execute the above steps S01 to S04 for a plurality of workpieces. For example, the robot controller 110 and the alignment controller 130 may alternate between a first procedure including processes of steps S01 to S04 for a plurality of substrate W1 and a second procedure including the processes of steps S01 to S04 for a single focus ring W2.

The series of processes described above is an example, and can be changed as appropriate. In the series of processes described above, the robot controller 110 and the alignment controller 130 may execute one step and the next step in parallel, or may execute each step in a different order from that of the above example. The robot controller 110 and the alignment controller 130 may omit any of the steps and may execute a process different from that of the above example in any of the steps.

In the series of processes described above, both of the adjustment of the posture of the substrate W1 and the adjustment of the center position of the substrate W1 are performed, but the adjustment of the posture of the substrate W1 may be performed without the adjustment of the center position of the substrate W1. The adjustment of the center position of the substrate W1 may be performed without the adjustment of the posture of the substrate W1. In the series of processes described above, both of the adjustment of the posture of the focus ring W2 and the adjustment of the center position of the focus ring W2 are performed. However, the adjustment of the posture of the focus ring W2 may be performed without the adjustment of the center position of the focus ring W2. The adjustment of the center position of the focus ring W2 may be performed without the adjustment of the posture of the focus ring W2. The substrate W1 and the focus ring W2 may be different from each other in thing to be adjusted.

Although the alignment apparatus 30 described above holds the substrate W1 or the focus ring W2 by pads or suction, the alignment apparatus (the rotational support) may be configured to hold the substrate W1 and the focus ring W2 by gripping. In this case, the rotational support 40 may grip the workpiece so that the center position of the workpiece approaches the central axis Ax4 when the workpiece to be transported is gripped.

Although the edge sensor 90 described above detects the position of the inner peripheral edge E21 of the focus ring W2 as the edge position of the focus ring W2, in other examples the edge sensor 90 may detect the position of the outer peripheral edge E22 of the focus ring W2 as the edge position of the focus ring W2. The second indicator Id2 may be provided on the outer peripheral edge E22.

Additionally, and unlike at least some of the examples described above, the height positions of the first substrate supports 41 may substantially coincide with the height positions of the first ring supports 42. The height positions of the second substrate supports 61 may substantially coincide with the height positions of the second ring supports 62.

As described in some of the above examples, the alignment apparatus 30 may include the rotational support 40 configured to rotate around a central axis Ax4, the rotational support 40 including first substrate supports 41 and the first ring supports 42. The first substrate supports 41 surround the central axis Ax4 and are configured to concurrently support the substrate W1. The first ring supports 42 surround the central axis Ax4 and are configured to concurrently support a focus ring W2. Additionally, the alignment apparatus 30 may include the rotation actuator 50 configured to rotate the rotational support 40 around the central axis Ax4 and an edge sensor 90 configured to detect the edge position of the substrate W1 supported by the first substrate supports 41 and an edge position of the focus ring W2 supported by the ring supports 42. Still further, the alignment apparatus 30 may include the substrate posture control unit 144 and the ring posture control unit 154. The substrate posture control unit 144 may be configured to control the rotation actuator 50 to adjust a posture of the substrate W1 around the central axis Ax to the first target posture based on the edge position of the substrate W1 detected by the edge sensor 90. Additionally, the ring posture control unit 154 may be configured to control the rotation actuator 50 to adjust a posture of the focus ring W2 around the central axis Ax4 to a second target posture based on the edge position of the focus ring W2 detected by the edge sensor 90.

In the alignment apparatus 30, the posture of the substrate W1 and the posture of the focus ring W2 are individually adjusted. Since the postures of the substrate W1 and the focus ring W2 may be adjusted by a single apparatus, it is useful for space saving.

The edge position of the substrate W1 detected by the edge sensor 90 may include the position of the outer peripheral edge E1 of the substrate W1. The edge position of the focus ring W2 detected by the edge sensor 90 may include the position of the inner peripheral edge E21 of the focus ring W2. The inner diameter of the focus ring W2 tends to be substantially the same as the outer diameter of the substrate W1. Therefore, the detection range of the edge sensor 90 may be reduced as compared with the case of detecting the position of the outer peripheral edge E22 of the focus ring W2. Therefore, it is useful for achieving both the sharing of the apparatus and the simplification of the alignment apparatus.

The outer peripheral edge E1 of the substrate W1 may include the first indicator Id1. The inner peripheral edge E21 of the focus ring W2 may include the second indicator Id2. The substrate posture control unit 144 may be configured to detect the first indicator Id1 based on the edge position of the substrate W1 detected by the edge sensor 90, and to control the rotation actuator 50 to adjust the position of the first indicator Id1 to the first target position corresponding to the first target posture. The ring posture control unit 154 may be configured to detect the second indicator Id2 based on the edge position of the focus ring W2 detected by the edge sensor 90, and to control the rotation actuator 50 to adjust the position of the second indicator Id2 to the second target position corresponding to the second target posture. In some examples, the posture of the workpiece is adjusted using each of the first indicator Id1 and the second indicator Id2. Therefore, it is useful for more accurately adjusting the postures of the substrate W1 and the focus ring W2.

The distance between each of the first ring supports 42 and the central axis Ax may be greater than the distance between each of the first substrate supports 41 and the central axis Ax. The height positions of the first ring supports 42 are higher than the height positions of the first substrate supports 41. In some examples, the rotational support 40 may be divided into a portion for supporting the substrate W1 and a portion for supporting the focus ring W2. Therefore, it is useful for reducing an influence from one workpiece to the other workpiece such as adhesion of particles.

The alignment apparatus 30 further may include the lifting support 60 and the lifting actuator 70. The lifting support 60 may include the second substrate supports 61 surrounding the central axis Ax4 and configured to concurrently support the substrate W1, and the second ring supports 62 surrounding the central axis Ax4 and configured to concurrently support the focus ring W2. The lifting actuator 70 may be configured to move the lifting support 60 along the central axis Ax4 so as to switch between a state in which the rotational support 40 supports the substrate W1 and a state in which the lifting support 60 supports the substrate W1. The lifting actuator 60 may be further configured to move the lifting support 60 along the central axis Ax4 so as to switch between a state in which the rotational support 40 supports the focus ring W2 and a state in which the lifting support 60 supports the focus ring W2. In some examples, although the posture of the rotational support 40 around the central axis Ax4 may vary with the rotation by the rotation actuator 50, the posture of the lifting support 60 around the central axis Ax4 may be constant. Therefore, by transferring the workpiece to be adjusted to and from the transfer robot 12 via the lifting support 60, the transfer to and from the transfer robot 12 is facilitated. Therefore, it is useful for simplifying the transport operation of the transfer robot 12.

The distance between each of the second ring supports 62 and the central axis Ax4 is greater than the distance between each of the second substrate supports 61 and the central axis Ax4. The height positions of the second ring supports 62 are higher than the height positions of the second substrate supports 61. In some examples, the lifting support 60 can be divided into a portion supporting the substrate W1 and a portion supporting the focus ring W2. Therefore, it is useful for reducing an influence from one workpiece to the other workpiece such as adhesion of particles.

The alignment apparatus 30 may further include the first profile generating unit 138 and the second profile generating unit 148. The first profile generating unit 138 may be configured to generate the substrate edge profile based on the edge position of the substrate W1 detected by the edge sensor 90 while the rotational support 40 is rotating by the rotation actuator 50, the substrate edge profile indicating a relationship between a rotation angle of the rotational support 40 around the central axis Ax4 and the edge position of the substrate W1. The second profile generating unit 148 may be configured to generate the ring edge profile based on the edge position of the focus ring W2 detected by the edge sensor 90 while the rotational support 40 is rotating by the rotation actuator 50, the ring edge profile indicating the relationship between the rotation angle of the rotational support 40 around the central axis Ax4 and the edge position of the focus ring W2. Additionally, the alignment apparatus 30 may include the first position calculating unit 142 configured to calculate a center position of the substrate W1 in the rotational support 40 based on the substrate edge profile, and the second position calculating unit 152 configured to calculate a center position of the focus ring W2 in the rotational support 40 based on the ring edge profile. In some examples, the center position of the substrate W1 and the center position of the focus ring W2 are calculated by the alignment apparatus 30. Therefore, a part of the processing required for adjusting the center position of the substrate W1 and the center position of the focus ring W2 may be performed by a single apparatus. Therefore, it is useful for space saving of the apparatus for adjusting the postures and the positions of the substrate W1 and the focus ring W2.

In some of the examples described above, the transport system 1 may include the alignment apparatus 30, the transfer robot 12 configured to transfer the substrate W1 with a hand 14 of the transfer robot 12 and the focus ring W2 with the hand 14, and the first receiving control unit 118 configured to adjust the position of the hand 14 based on the calculation result of the center position of the substrate W1 and to control the transfer robot 12 so that the hand 14 receives the substrate W1 from the alignment apparatus 30. Additionally, the transport system 1 may include the second receiving control unit 124 configured to adjust the position of the hand 14 based on the calculation result of the center position of the focus ring W2 and to control the transfer robot 12 so that the hand 14 receives the focus ring W2 from the alignment apparatus 30. As described above, since the postures and the center positions of the substrate W1 and the focus ring W2 may be adjusted by a single system, it is useful for space saving.

Still further, at least some of the example substrate transport methods described above include detecting an edge position of a substrate W1 by an edge sensor 90 around a predetermined central axis Ax4 while the rotational support 40 supporting the substrate W1 at a plurality of positions P1 is rotating surrounding the central axis Ax4, and generating the substrate edge profile based on the edge position of the substrate W1 detected by the edge sensor 90, the substrate edge profile indicating a relationship between a rotation angle of the rotational support 40 around the central axis Ax4 and the edge position of the substrate W1. Additionally, the substrate transport methods may include calculating a center position of the substrate W1 in the rotational support 40 based on the substrate edge profile, and adjusting the position of the hand 14 based on the calculation result of the center position of the substrate W1 and controlling the transfer robot 12 so that the hand 14 supports and conveys the substrate W1, and detecting an edge position of the focus ring W2 by the edge sensor 90 while the rotational support 40 supporting the focus ring W2 at a plurality of positions P2 is rotating surrounding the central axis Ax4. Still further, the substrate transport methods may include generating the ring edge profile based on an edge position of the focus ring W2 detected by the edge sensor 90, the ring edge profile indicating the relationship between the rotational angle of the rotational support 40 around the central axis Ax4 and the edge position of the focus ring W2, calculating a center position of the focus ring W2 in the rotational support based on the ring edge profile, and adjusting the position of the hand 14 based on the calculation result of the center position of the focus ring W2 and controlling the transfer robot 12 so that the hand 14 supports and conveys the focus ring W2. In some example transport methods, the center position of the substrate W1 and the center position of the focus ring W2 are respectively adjusted using the common rotational support and the edge sensor. As described above, since the center positions of the substrate W1 and the focus ring W2 may be adjusted by a single system, it is useful for space saving.

Although certain procedures or operations are described herein as being performed sequentially or in a particular order, in some examples one or more of the operations may be performed in a different order, in parallel, simultaneously with each other, or in an overlapping manner. Additionally, in some examples, one or more of the operations may be optionally performed or, in some cases, omitted altogether.

Furthermore, it is to be understood that not all aspects, advantages and features described herein may necessarily be achieved by, or included in, any one particular example. Indeed, having described and illustrated various examples herein, it should be apparent that other examples may be modified in arrangement and detail. We claim all modifications and variations coining within the spirit and scope of the subject matter claimed herein.

What is claimed is:

1. An alignment apparatus comprising:
    a rotational support configured to rotate around a central axis, the rotational support comprising:
        a plurality of substrate supports surrounding the central axis and configured to concurrently support a substrate; and
        a plurality of ring supports arranged at a fixed radial distance from the central axis of the rotational support, and configured to concurrently support a focus ring;
    a rotation actuator configured to rotate the rotational support around the central axis;
    an edge sensor configured to generate an edge signal that changes in accordance with each of an edge position of the substrate supported by the substrate supports and an edge position of the focus ring supported by the ring supports;
    control circuitry configured to:
        control the rotation actuator to adjust a posture of the substrate around the central axis to a first target posture based on the edge signal; and
        control the rotation actuator to adjust a posture of the focus ring around the central axis to a second target posture based on the edge signal;
    a non-rotatable lifting support comprising
        a plurality of second ring supports arranged at the fixed radial distance from the central axis of the rotational support, and configured to concurrently support the focus ring; and
    a lifting actuator configured to move the lifting support along the central axis to switch between a first operating state in which the rotational support supports the focus ring and a second operating state in which the lifting support supports the focus ring.

2. The alignment apparatus according to claim 1, wherein the edge position of the substrate is a position of an outer peripheral edge of the substrate; and
wherein the edge position of the focus ring is a position of an inner peripheral edge of the focus ring.

3. The alignment apparatus according to claim 2, wherein the outer peripheral edge of the substrate includes a first indicator;
wherein the inner peripheral edge of the focus ring includes a second indicator; and
wherein the control circuitry is further configured to:
detect the first indicator based on the edge signal;
control the rotation actuator to adjust a position of the first indicator to a first target position corresponding to the first target posture;
detect the second indicator based on the edge signal; and
control the rotation actuator to adjust a position of the second indicator to a second target position corresponding to the second target posture.

4. The alignment apparatus according to claim 2, wherein a difference between an outer diameter of the substrate and an inner diameter of the focus ring is smaller than a difference between the outer diameter of the substrate and an outer diameter of the focus ring;
wherein the edge sensor is configured to generate the edge signal by irradiating light to an irradiation region extending in a radial direction of the central axis;
wherein a distance between an inner end of the irradiation region and the central axis is smaller than half of the outer diameter of the substrate and is also smaller than half of the inner diameter of the focus ring; and
wherein a distance between an outer end of the irradiation region and the central axis is greater than half of the outer diameter of the substrate and is also greater than half of the inner diameter of the focus ring.

5. The alignment apparatus according to claim 4, wherein the edge sensor includes:
an irradiation section configured to irradiate light to the irradiation region; and
a light receiving section arranged to face the irradiation section and configured to receive the light from the irradiation section.

6. The alignment apparatus according to claim 5, wherein the edge sensor is configured to generate the edge signal based on the light received from the irradiation section;
wherein the control circuitry is further configured to:
obtain workpiece information indicating whether a workpiece is the substrate or the focus ring; and
detect each of the edge position of the substrate and the edge position of the focus ring based on the workpiece information and the edge signal.

7. The alignment apparatus according to claim 6, wherein the control circuitry is configured to:
detect the edge position of the substrate by scanning the substrate in a scanning direction to identify a first transition from where the light is blocked by the substrate to where the light is not blocked by the substrate; and
detect the edge position of the focus ring by scanning the focus ring in the scanning direction to identify a second transition from where the light is not blocked by the focus ring to where the light is blocked by the focus ring, the second transition opposite from the first transition.

8. The alignment apparatus according to claim 6, wherein the control circuitry is configured to:
detect the edge position of the substrate by scanning the substrate in a scanning direction to identify a first transition from where the light is not blocked by the substrate to where the light is blocked by the substrate; and
detect the edge position of the focus ring by scanning the focus ring in the scanning direction to identify a second transition from where the light is blocked by the focus ring to where the light is not blocked by the focus ring, the second transition opposite from the first transition.

9. The alignment apparatus according to claim 1, wherein the substrate supports are configured to support a back surface of the substrate; and
wherein the ring supports are configured to support a back surface of the focus ring.

10. The alignment apparatus according to claim 1, wherein a distance between each of the ring supports and the central axis is greater than a distance between each of the substrate supports and the central axis, and
wherein the ring supports are spaced apart from, and positioned higher than, the substrate supports in an axial direction of the central axis.

11. The alignment apparatus according to claim 1, wherein the lifting support includes a plurality of second substrate supports surrounding the central axis and configured to concurrently support the substrate; and
wherein the lifting actuator is further configured to move the lifting support along the central axis to switch between a third operating state in which the rotational support supports the substrate and a fourth operating state in which the lifting support supports the substrate.

12. The alignment apparatus according to claim 11, wherein a distance between each of the second ring supports and the central axis is greater than a distance between each of the second substrate supports and the central axis, and
wherein the second ring supports are positioned higher than the second substrate supports in an axial direction of the central axis.

13. The alignment apparatus according to claim 1, wherein the control circuitry is further configured to:
generate a substrate edge profile based on the edge position of the substrate detected with the edge sensor while the rotational support is rotating by the rotation actuator, the substrate edge profile indicating a relationship between a rotation angle of the rotational support around the central axis and the edge position of the substrate;
generate a ring edge profile based on the edge position of the focus ring detected with the edge sensor while the rotational support is rotating by the rotation actuator, the ring edge profile indicating a relationship between the rotation angle of the rotational support around the central axis and the edge position of the focus ring;
calculate a center position of the substrate in the rotational support based on the substrate edge profile; and
calculate a center position of the focus ring in the rotational support based on the ring edge profile.

14. An alignment apparatus comprising:
a rotational support configured to rotate around a central axis, the rotational support comprising:

a plurality of first substrate supports surrounding the central axis and configured to concurrently support a substrate; and
a plurality of first ring supports surrounding the central axis and configured to concurrently support a focus ring;
a rotation actuator configured to rotate the rotational support around the central axis;
an edge sensor configured to generate an edge signal that changes in accordance with each of an edge position of the substrate supported by the first substrate supports and an edge position of the focus ring supported by the first ring supports;
control circuitry configured to:
    control the rotation actuator to adjust a posture of the substrate around the central axis to a first target posture based on the edge signal; and
    control the rotation actuator to adjust a posture of the focus ring around the central axis to a second target posture based on the edge signal;
a lifting support comprising:
    a plurality of second substrate supports surrounding the central axis and configured to concurrently support the substrate; and
    a plurality of second ring supports surrounding the central axis and configured to concurrently support the focus ring; and
a lifting actuator configured to:
    move the lifting support along the central axis to switch between a first operating state in which the rotational support supports the substrate and a second operating state in which the lifting support supports the substrate; and
    move the lifting support along the central axis to switch between a third operating state in which the rotational support supports the focus ring and a fourth operating state in which the lifting support supports the focus ring;
    wherein the plurality of second substrate supports and the plurality of second ring supports all concurrently move together when the lifting support is moved by the lifting actuator to switch between the first operating state and the second operating state, and when the lifting support is moved by the lifting actuator to switch between the third operating state and the fourth operating state.

15. The alignment apparatus according to claim 14, wherein the plurality of first ring supports are alternately arranged between the plurality of second ring supports around the rotational support at a fixed radial distance from the central axis.

16. An alignment apparatus comprising:
a rotational support configured to rotate around a central axis, the rotational support comprising:
    a plurality of rotating arms that extend radially from the central axis;
    a plurality of substrate supports attached to and located on the plurality of rotating arms around the central axis, and configured to concurrently support a substrate; and
    a plurality of ring supports attached to and located on the plurality of rotating arms around the central axis, and configured to concurrently support a focus ring, wherein the ring supports are spaced apart from the substrate supports in an axial direction of the central axis;
a rotation actuator configured to rotate the rotational support around the central axis;
an edge sensor configured to generate an edge signal that changes in accordance with each of an edge position of the substrate supported by the substrate supports and an edge position of the focus ring supported by the ring supports; and
control circuitry configured to:
    control the rotation actuator to adjust a posture of the substrate around the central axis to a first target posture based on the edge signal; and
    control the rotation actuator to adjust a posture of the focus ring around the central axis to a second target posture based on the edge signal.

17. The alignment apparatus according to claim 16, wherein a distance between each of the ring supports and the central axis is greater than a distance between each of the substrate supports and the central axis.

18. The alignment apparatus according to claim 17, wherein the ring supports are spaced apart from, and positioned higher than, the substrate supports in an axial direction of the central axis.

19. The alignment apparatus according to claim 14, wherein the lifting support is a non-rotatable lifting support.

20. The alignment apparatus according to claim 1, wherein the non-rotatable lifting support further comprises a plurality of second substrate supports surrounding the central axis and configured to concurrently support the substrate; and
    wherein the plurality of second substrate supports and the plurality of second ring supports all concurrently move together when the non-rotatable lifting support is moved by the lifting actuator to switch between the first operating state and the second operating state.

* * * * *